(12) United States Patent
Choi et al.

(10) Patent No.: US 8,305,311 B2
(45) Date of Patent: Nov. 6, 2012

(54) ORGANIC LIGHT EMITTING DIODE DISPLAY AND METHOD FOR MANUFACTURING THE SAME

(75) Inventors: Joon-Hoo Choi, Seoul (KR); Kyu-Sik Cho, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/464,790

(22) Filed: May 4, 2012

(65) Prior Publication Data

US 2012/0217517 A1 Aug. 30, 2012

Related U.S. Application Data

(62) Division of application No. 12/239,632, filed on Sep. 26, 2008, now Pat. No. 8,188,948.

(30) Foreign Application Priority Data

Nov. 9, 2007 (KR) .................. 10-2007-0114155

(51) Int. Cl.
*G09G 3/32* (2006.01)
*H01L 29/10* (2006.01)

(52) U.S. Cl. ............... 345/83; 345/82; 257/49; 257/52; 257/57; 257/59

(58) Field of Classification Search .............. 345/76, 345/77, 82, 83, 84, 87, 88, 89, 92; 348/142, 348/149, 151, 164; 257/49, 52, 57, 59, 66, 257/72, E27.001, E27.111; 315/160, 169.1, 315/169.3; 313/483, 498, 505, 506
See application file for complete search history.

(56) References Cited

U.S. PATENT DOCUMENTS

| | | | |
|---|---|---|---|
| 7,253,460 | B2 | 8/2007 | Nakamura |
| 7,545,449 | B2 | 6/2009 | Nakamura et al. |
| 2006/0187397 | A1 | 8/2006 | Nakamura et al. |
| 2007/0159565 | A1 | 7/2007 | Segawa et al. |
| 2007/0194326 | A1 | 8/2007 | Huh |
| 2009/0302319 | A1 | 12/2009 | Cho et al. |

FOREIGN PATENT DOCUMENTS

| | | |
|---|---|---|
| JP | 6-324350 | 11/1994 |
| JP | 10-062819 | 3/1998 |
| JP | 2002-014372 | 1/2001 |
| JP | 2002-131783 | 5/2002 |
| JP | 2006-013524 | 1/2006 |
| KR | 1998-042890 | 8/1998 |
| KR | 10-0303069 | 7/2001 |
| KR | 10-0310707 | 9/2001 |
| KR | 2004-0005260 | 1/2004 |
| KR | 2004-0045113 | 6/2004 |
| KR | 10-0498158 | 6/2005 |

*Primary Examiner* — My-Chau T Tran
(74) *Attorney, Agent, or Firm* — Innovation Counsel LLP

(57) ABSTRACT

An organic light emitting device according to one or more embodiments includes a gate line, a data line intersecting the gate line, a switching thin film transistor connected to the gate line and the data line, a driving thin film transistor connected to the switching thin film transistor, and a light emitting diode (LED) connected to the driving thin film transistor. The switching thin film transistor includes a control electrode connected to the gate line, a crystalline semiconductor overlapping the control electrode, and an input electrode and an output electrode are spaced apart from each other on the crystalline semiconductor, wherein the control electrode and the gate line are respectively disposed under and on the crystalline semiconductor and include different materials.

13 Claims, 25 Drawing Sheets

ORGANIC LIGHT EMITTING DIODE DISPLAY AND METHOD FOR MANUFACTURING THE SAME

CROSS-REFERENCE TO RELATED APPLICATION

This application is a divisional patent application of U.S. patent application Ser. No. 12/239,632, filed on Sep. 26, 2008, which application claims priority to and the benefit of Korean Patent Application No. 10-2007-0114155 filed in the Korean Intellectual Property Office on Nov. 9, 2007, the entire contents of which are incorporated herein by their references.

BACKGROUND (a) Technical Field

Embodiments of the present invention relate to an organic light emitting device and a method for manufacturing the same.

(b) Description of the Related Art

Recent trends toward lightweight and thin personal computers and television sets require lightweight and thin display devices, and flat panel displays such as a liquid crystal display (LCD) that satisfy such requirements are increasingly being used in place of conventional cathode ray tubes (CRTs).

However, because the LCD is a passive display device, an additional back-light may be needed as a light source. Also, the LCD may have various problems such as a slow response time and a narrow viewing angle.

Among the flat panel displays, an organic light emitting device (organic light emitting diode display, OLED display) has recently become the most promising as a display device for solving these problems.

The OLED display includes two electrodes and an organic light emitting layer interposed between the two electrodes. One of the two electrodes injects holes and the other electrode injects electrons into the light emitting layer. The injected electrons and holes are combined to form excitons, and the excitons in turn emit light as they release energy.

Because the OLED display is a self-emissive display device, an additional light source is not necessary such that the organic light emitting device has lower power consumption as well as a high response speed, wide viewing angle, and high contrast ratio.

The OLED display may be classified as a passive matrix OLED display and an active matrix OLED display according to driving type. In the active OLED display, an electrode and an emission layer are disposed on a thin film transistor array panel. The thin film transistor array panel includes signal lines, switching thin film transistors connected to the signal lines for controlling data voltages, and driving thin film transistors directing the current to a light-emitting device by applying the transmitted data voltages as gate voltages.

Also, the OLED display may be classified as a bottom emission type and a top emission type according to the direction of emission. In the bottom emission type, the light emitted from the emission layer passes through a thin film transistor array panel to exit the display. In contrast, in the top emission type, the light emitted from the emission layer passes through a common electrode to exit the display. For a high aperture ratio, the top emission type may be used because an aperture ratio of the top emission type is not influenced by the presence of the signal lines and the thin film transistors.

In an active matrix OLED display, high mobility, high stability, and uniformity of the thin film transistor are required. To satisfy these characteristics, a bottom gate structure using a polysilicon as a semiconductor may be considered, but because the process of high temperature crystallization of an amorphous silicon is required, the gate metal is limited to using a material having a high melting point. However, a signal line having low resistivity must be used to prevent, for example, a signal delay in a large-sized OLED display, but because a low resistivity material for signal lines has a low melting point, such material may not be used as the gate metal.

Also, while the OLED display of the top emission type may obtain a high aperture ratio, the common electrode must be made of a transparent conductive material. However, because the transparent conductive material has a high resistivity, a drop in the common voltage may be generated.

SUMMARY

Systems and methods are disclosed, in accordance with one or more embodiments, to reduce a signal delay, to improve the characteristics of a thin film transistor, and to prevent a voltage drop of the common voltage in an organic light emitting device of a top emission type.

An organic light emitting diode (OLED) display according to an exemplary embodiment of the present invention includes a gate line, a data line intersecting the gate line, a switching thin film transistor connected to the gate line and the data line, a driving thin film transistor connected to the switching thin film transistor, and a light emitting diode (LED) connected to the driving thin film transistor. The switching thin film transistor includes a control electrode connected to the gate line, a crystalline semiconductor overlapping the control electrode, and an input electrode and an output electrode are spaced apart from each other on the crystalline semiconductor, wherein the control electrode and the gate line are respectively disposed under and on the crystalline semiconductor and include different materials.

According to an embodiment, the gate line may include a metal having a melting point less than that of the control electrode. For example, the gate line may include one selected from an aluminum-containing metal, a copper-containing metal, and a silver-containing metal, and the control electrode may include one selected from a molybdenum-containing metal, a chromium-containing metal, a titanium-containing metal, a tantalum-containing metal, and a tungsten-containing metal.

According to an embodiment, the light emitting diode (LED) may include a first electrode connected to the driving thin film transistor, a second electrode spaced apart from the first electrode, and a light emitting member disposed between the first electrode and the second electrode, wherein the first electrode may be disposed on the same layer as the gate line. The first electrode may include, according to an embodiment, a first layer including a metal and a second layer including a transparent conductive material, wherein the second layer may contact the light emitting member. The first electrode and the gate line may be formed on the same layer, and a voltage assistant line may be connected to the second electrode.

In an embodiment, the OLED display may further include an organic insulating layer formed on the first electrode, wherein the organic insulating layer may have an opening defining the light emitting member and a contact hole exposing the voltage assistant line.

In an embodiment, the light emitting diode (LED) may include a first electrode connected to the driving thin film transistor, a second electrode spaced apart from the first electrode, and a light emitting member disposed between the first electrode and the second electrode, and may further include a first protecting member formed on the same layer as the first electrode and covering the gate line.

In another embodiment, the OLED display may further include a connecting member connecting the driving thin film transistor and the switching thin film transistor, and may be formed on the same layer as the gate line. The OLED display may further include a second protecting member formed on the same layer as the first electrode and covering the connecting member.

An OLED display according to another exemplary embodiment of the present invention includes: a first control electrode and a second control electrode formed on a substrate; a first crystalline semiconductor and a second crystalline semiconductor formed on the first control electrode and the second control electrode; a first input electrode and a first output electrode spaced apart from each other on the first crystalline semiconductor; a second input electrode and a second output electrode spaced apart from each other on the second crystalline semiconductor; an insulating layer formed on the first input electrode, the first output electrode, the second input electrode, and the second output electrode, and having a first contact hole exposing the first control electrode, a second contact hole exposing the first output electrode, a third contact hole exposing the second control electrode, and a fourth contact hole exposing the second output electrode; a gate line formed on the insulating layer and connected to the first control electrode through the first contact hole; a pixel electrode connected to the second output electrode through the fourth contact hole; a common electrode facing the pixel electrode; and a light emitting member disposed between the pixel electrode and the common electrode.

According to an embodiment, the gate line may include a metal having a lower melting point than that of the first control electrode. For example, the gate line may include one selected from an aluminum-containing metal, a copper-containing metal, and a silver-containing metal, and the first control electrode may include one selected from a molybdenum-containing metal, a chromium-containing metal, a titanium-containing metal, a tantalum-containing metal, and a tungsten-containing metal. The gate line and the pixel electrode may be formed on the same layer.

In an embodiment, the OLED display may further include a connecting member connecting the first output electrode and the second control electrode to each other through the second contact hole and the third contact hole, wherein the connecting member is formed on the same layer as the gate line and the pixel electrode. The OLED display according to an embodiment may further include a voltage assistant line connected to the common electrode, wherein the voltage assistant line is formed on the same layer as the gate line, the pixel electrode, and the connecting member. In another embodiment, the OLED display may further include a voltage assistant line connected to the common electrode, wherein the voltage assistant line is formed on the same layer as the gate line and the pixel electrode.

A method for manufacturing an OLED display according to an exemplary embodiment of the present invention includes: forming a first control electrode and a second control electrode on a substrate; forming a first crystalline semiconductor and a second crystalline semiconductor on the first control electrode and the second control electrode; forming the first input electrode and the first output electrode facing each other on the first crystalline semiconductor, and forming the second input electrode and the second output electrode facing each other on the second crystalline semiconductor; forming an insulating layer on the first input electrode, the first output electrode, the second input electrode, and the second output electrode; forming a gate line connected to the first control electrode on the insulating layer; forming a pixel electrode on the insulating layer; forming a light emitting member on the pixel electrode; and forming a common electrode on the light emitting member.

According to an embodiment, the forming of the first crystalline semiconductor and the second crystalline semiconductor may include depositing an amorphous silicon layer, and crystallizing the amorphous silicon layer by using solid phase crystallization (SPC).

In an embodiment, the first control electrode and the second control electrode may include a first metal having a higher melting point than a temperature of solid phase crystallization, and the gate line includes a second metal having a lower melting point than that of the first metal.

According to an embodiment, the protecting member covering the gate line may be formed during the forming of the pixel electrode. The gate line and the pixel electrode may be formed in the same step (concurrently). A voltage assistant line connected to the common electrode may be formed with the gate line and the pixel electrode in the same step (concurrently).

A method for manufacturing an OLED display according to another exemplary embodiment of the present invention includes: depositing a first metal layer on a substrate; patterning the first metal layer by photolithography to form a control electrode; depositing an amorphous semiconductor on the control electrode; crystallizing the amorphous semiconductor; forming an insulating layer having a contact hole on the crystallized semiconductor; depositing a second metal layer on the insulating layer; and patterning the second metal layer by photolithography to form a gate line connected to the control electrode through the contact hole, wherein the first metal layer has a higher melting point than a temperature for crystallizing the amorphous semiconductor, and the second metal layer has a lower melting point than that of the first metal layer. A pixel electrode separated from the gate line may be formed during the forming of the gate line.

DETAILED DESCRIPTION

Figure 1:
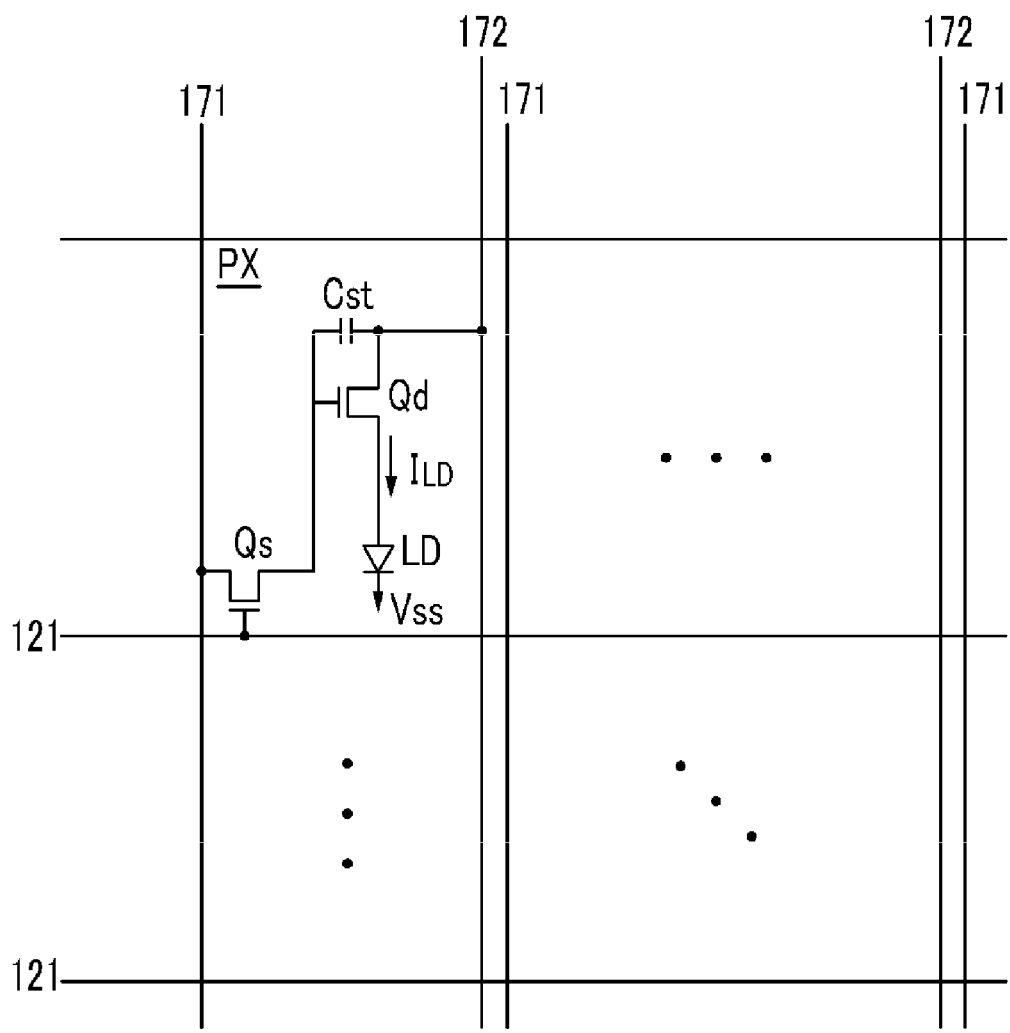
FIG. 1 is an equivalent circuit diagram of an OLED display according to an exemplary embodiment of the present invention.

Embodiments of the present invention will be described more fully hereinafter with reference to the accompanying drawings. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

EXEMPLARY EMBODIMENT 1

Now, an OLED display according to an embodiment of the present invention will be described in detail with reference to FIG. 1. FIG. 1 is an equivalent circuit diagram of an OLED display according to an exemplary embodiment of the present invention.

Referring to FIG. 1, an OLED display according to the present exemplary embodiment includes a plurality of signal lines 121 (also referred to as "gate lines"), 171 (also referred to as "transmitting data lines"), and 172 (also referred to as "driving voltage lines"), and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qd, a capacitor Cst, and an organic light emitting diode LD. The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current $I_{LD}$ having a magnitude that depends on the voltage between the control terminal and the output terminal thereof, and outputs such $I_{LD}$ to the organic light emitting diode LD.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity depending on an output current $I_{LD}$ of the driving transistor Qd, and thereby displays images.

The switching transistor Qs and the driving transistor Qd may be n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

Next, the OLED display shown in FIG. 1 according to an embodiment will be described in detail with reference to FIG. 2, FIG. 3, and FIG. 1. In the present exemplary embodiment, an OLED display of a bottom emission type will be described.

Figure 2:
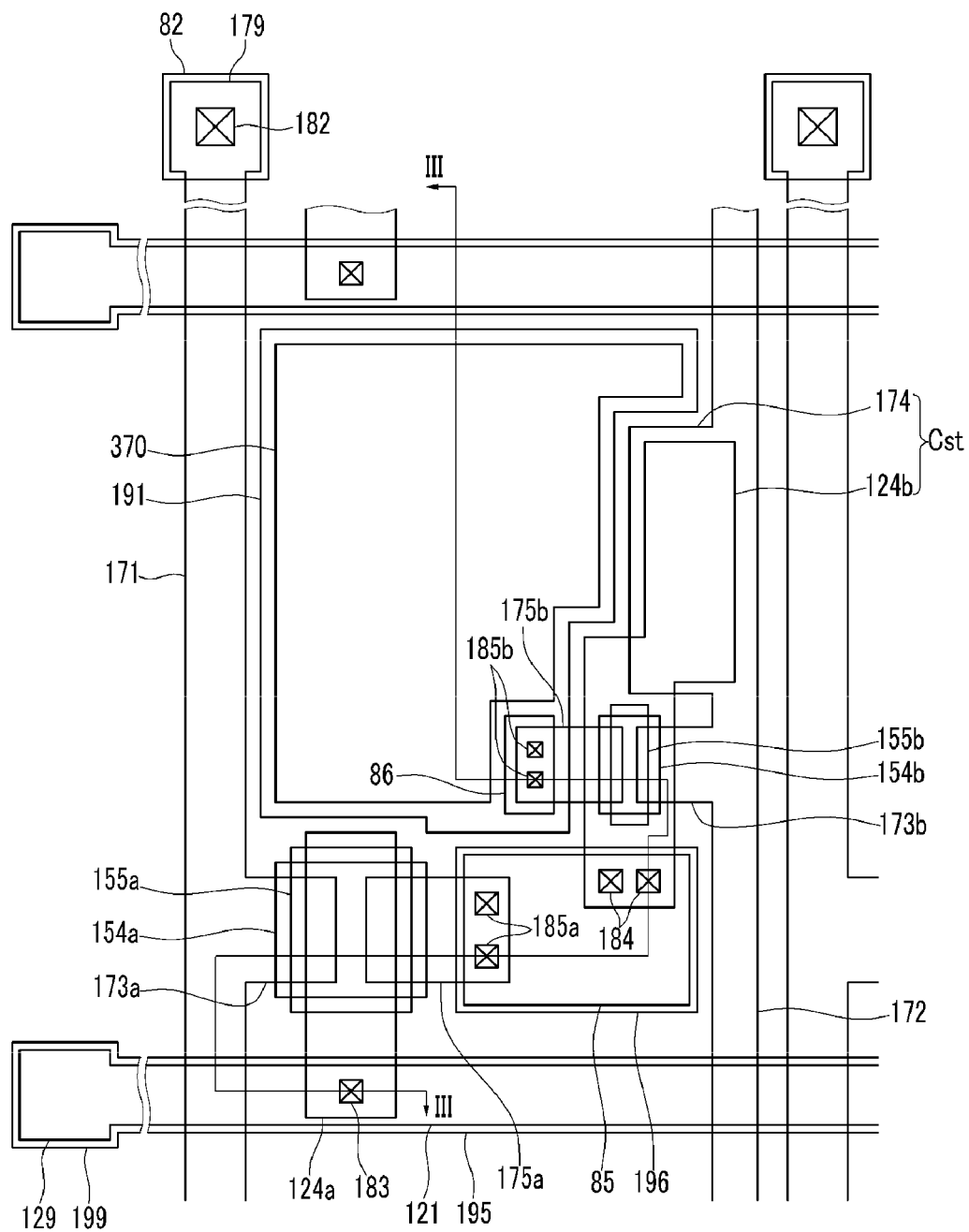
FIG. 2 is a layout view of an OLED display according to an exemplary embodiment of the present invention.
Figure 3:
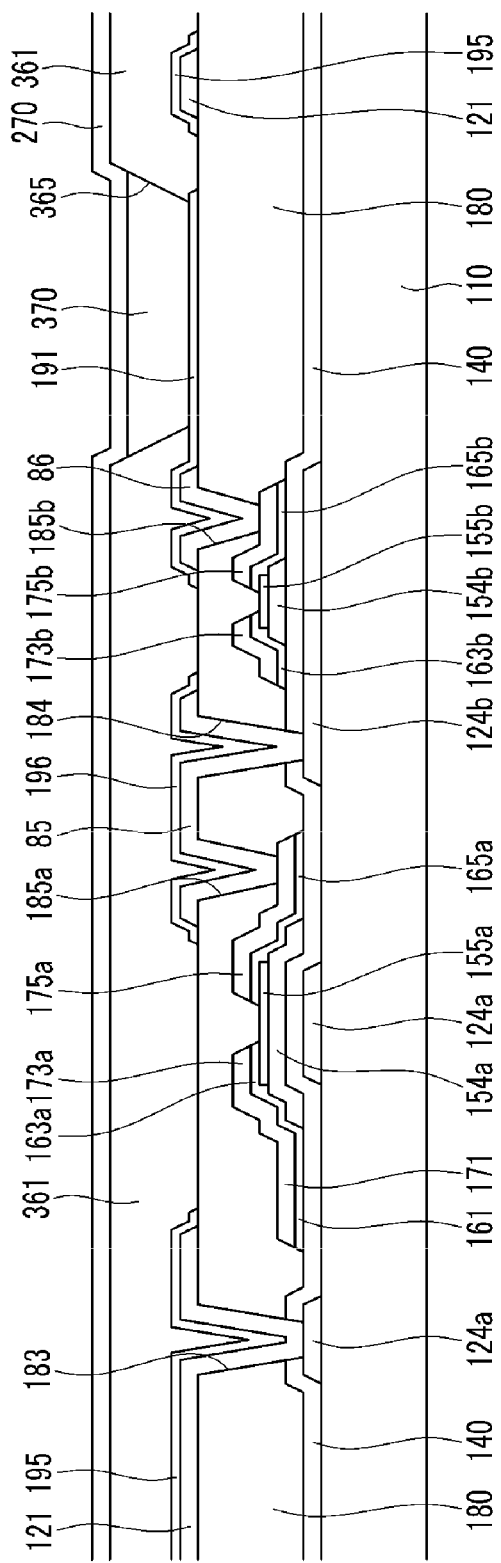
FIG. 3 is a cross-sectional view of the OLED display shown in FIG. 2 taken along the line III-III.

FIG. 2 is a layout view of an OLED display according to an exemplary embodiment of the present invention, and FIG. 3 is a cross-sectional view of the OLED display shown in FIG. 2 taken along the line III-III.

A plurality of switching control electrodes 124a and a plurality of driving control electrodes 124b are formed on an insulating substrate 110 made of a material such as transparent glass, plastic, or the like.

The switching control electrode 124a and the driving control electrode 124b are separated from each other and may be of an island type. According to one or more embodiments, the switching control electrode 124a and the driving control electrode 124b may be made of a refractory metal such as a molybdenum-containing metal including molybdenum (Mo) or a molybdenum alloy (Mo alloy), a chromium-containing metal including chromium (Cr) or a chromium alloy (Cr alloy), a titanium-containing metal including titanium (Ti) or a titanium alloy (Ti alloy), a tantalum-containing metal including tantalum (Ta) or a tantalum alloy (Ta alloy), and a tungsten-containing metal including tungsten (W) or a tungsten alloy (W alloy); however, this is not necessarily limiting.

According to one or more embodiments, a gate insulating layer 140 may be made of silicon nitride ($SiN_x$) or silicon oxide ($SiO_2$) and may be formed on the switching control electrode 124a, the driving control electrode 124b and the insulating substrate 110.

A plurality of switching semiconductors 154a and a plurality of driving semiconductors 154b may be formed on the gate insulating layer 140. The switching semiconductors 154a and the driving semiconductors 154b may be made respectively of an island type. The switching semiconductors 154a overlap the switching control electrodes 124a, and the driving semiconductors 154b overlap the driving control electrodes 124b. According to an embodiment, the switching semiconductors 154a and the driving semiconductors 154b may be made of a crystallized silicon such as microcrystalline silicon or polycrystalline silicon, but this is not necessarily limiting.

A plurality of etch stoppers 155a and 155b are respectively formed on the switching semiconductors 154a and the driving semiconductors 154b. The etch stoppers 155a and 155b may be made of silicon nitride, and may protect the switching semiconductor 154a and the driving semiconductor 154b from being damaged.

A plurality of data lines 171, a plurality of switching output electrodes 175a, a plurality of driving voltage lines 172, and a plurality of driving output electrodes 175b are formed on the etch stoppers 155a and 155b, the switching semiconductors 154a, the driving semiconductors 154b, and the gate insulating layer 140.

The data lines 171 for transmitting data signals extend substantially in the longitudinal direction. Each data line 171 includes a plurality of switching input electrodes 173a extended toward the switching control electrodes 124a, and an end portion 179 having a large area for contact with another layer or with an external driving circuit. The switching output electrodes 175a are separated from the data lines 171, and are opposite to the switching input electrodes 173a on the switching semiconductors 154a.

The driving voltage lines 172 for transmitting driving voltages extend substantially in the longitudinal direction. Each driving voltage line 172 includes a plurality of driving input electrodes 173b extending toward the driving semiconductors 154b, and a plurality of storage electrodes 174 overlapping the driving control electrodes 124b. The driving control electrodes 124b overlap the storage electrodes 174 to form storage capacitors Cst.

The driving output electrodes 175b are separated from the data lines 171, the switching output electrodes 175a, and the driving voltage lines 172, and are opposite to the driving input electrodes 173b on the driving semiconductor 154b.

The data lines 171, the switching output electrodes 175a, the driving voltage lines 172, and the driving output electrodes 175b may be made of a conductive material having low resistivity.

A plurality of ohmic contacts 161, 163a, 163b, 165a, and 165b are formed under the data lines 171, the switching output electrodes 175a, the driving voltage lines 172, and the driving output electrodes 175b. According to one or more embodiments, the ohmic contacts 161, 163a, 163b, 165a, and 165b may be made of a material such as silicide or n+ hydrogenated a-Si heavily doped with an n-type impurity such as phosphorous, or they may be made of microcrystalline silicon or polycrystalline silicon, but this is not necessarily limiting.

The ohmic contacts 161, 163a, 163b, 165a, and 165b may have substantially the same plane shape as the data lines 171, the switching output electrodes 175a, the driving voltage lines 172, and the driving output electrodes 175b. However, the ohmic contacts 161, 163a, 163b, 165a, and 165b may only be formed between the switching semiconductors 154a and the switching input electrodes 173a, the switching semiconductors 154a and the switching output electrodes 175a, the driving semiconductors 154b and the driving input electrodes 173b, and the driving semiconductors 154b and the driving output electrodes 175b.

A passivation layer 180 is formed on the data lines 171, the switching output electrodes 175a, the driving voltage lines 172, and the driving output electrodes 175b. The passivation layer 180 has a plurality of contact holes 185a, 185b, 182 respectively exposing the switching output electrodes 175a, the driving output electrodes 175b, and end portions 179 of the data lines 171. The passivation layer 180 and the gate insulating layer 140 have a plurality of contact holes 183 and 184 respectively exposing the switching control electrodes 124a and the driving control electrodes 124b. A plurality of gate lines 121, a plurality of connecting members 85, and a plurality of contact assistant members 86 are formed on the passivation layer 180.

The gate lines 121 for transmitting gate signals extend substantially in a transverse direction and intersect the data lines 171 and the driving voltage lines 172. The gate lines 121 are connected to the switching control electrodes 124a through the contact holes 183, and include an end portion 129 having a large area for contact with another layer or with an external driving circuit.

The connecting members 85 connect the switching output electrodes 175a and the driving control electrodes 124b to each other through the contact holes 184 and 185a. The contact assistant members 86 are connected to the driving output electrodes 175b through the contact holes 185b.

According to one or more embodiments, the gate lines 121, the connecting members 85, and the contact assistant members 86 may be made of a metal having low resistivity such as an aluminum-containing metal including aluminum (Al) or an aluminum alloy (Al alloy), a silver-containing metal including silver (Ag) or a silver alloy Ag alloy, and a copper-containing metal including copper (Cu) or a copper alloy (Cu alloy). These low resistance metals may have a low melting point compared with the refractory metal of the switching control electrodes 124a and the driving control electrodes 124b.

A plurality of pixel electrodes 191, a plurality of first protecting members 195, second protecting members 196, and contact assistants 82 are formed on the gate lines 121, the connecting members 85, the contact assistant members 86, and the passivation layer 180.

The pixel electrodes 191 are electrically connected to the driving output electrodes 175b through the contact assistant members 86. The contact assistant members 86 improve the contact characteristic and adhesion between the driving output electrodes 175b and the pixel electrodes 191.

The first protecting members 195 cover the gate lines 121, and the second protecting members 196 cover the connecting members 85. In an embodiment, the first protecting members 195 and the second protecting members 196 may prevent the gate lines 121 and the connecting members 85 from corroding due to contact with, for example, a chemical solution such as an etchant in the photolithography process of the pixel electrodes 191.

The contact assistants 82 are connected to the end portions 179 of the data lines 171 through the contact holes 182. The contact assistants 82 enhance the adhesion characteristic between the end portions 179 of the data lines 171 and an external device and protect the end portions of the data lines 171.

According to one or more embodiments, the pixel electrodes 191, the first protecting members 195, the second protecting members 196, and the contact assistants 82 may be formed of a transparent conductive material such as indium tin oxide (ITO) or indium zinc oxide (IZO), but this is not necessarily limiting.

An organic insulating layer 361 is formed on the pixel electrodes 191, the first protecting members 195, the second protecting members 196, the contact assistants 82, and the passivation layer 180. The organic insulating layer 361 may have a plurality of openings 365 enclosing the edges of the pixel electrodes 191 like a bank.

A plurality of light emitting members 370 are formed on the pixel electrodes 191 and are confined in the openings 365. Each of the light emitting members 370 may have a multi-layered structure including an emitting layer (not shown) for emitting light and auxiliary layers (not shown) for improving the efficiency of light emission of the emitting layer.

According to one or more embodiments, each of the light emitting members 370 may be made of a low-molecular-weight compound or a high-molecular-weight compound, or a mixture thereof, and uniquely emits light of one primary color such as red, green, and blue.

The auxiliary layers may include an electron transport layer (not shown) and a hole transport layer (not shown) for improving the balance of electrons and holes, as well as an electron injecting layer (not shown) and a hole injecting layer (not shown) for improving the injection of electrons and holes.

According to one or more embodiments, the light emitting members 370 may uniquely emit light of one of the primary colors such as red, green, and blue, and may be respectively arranged in each pixel. The light emitting members 370 that emit light of three colors such as red, green, and blue may all be arranged in one pixel with vertical or horizontal deposition to form a white emitting layer under or above the color filters emitting light of one of the primary colors such as red, green, and blue.

Also, a four-color structure including red, green, blue, and white pixels may be arranged in a stripe or check pattern to improve the luminance as well as the three color structure including red, green, and blue pixels.

A common electrode 270 is formed on the organic light emitting members 370. According to one or more embodiments, the common electrode 270 may be disposed on the whole surface of the substrate, and may be formed of an opaque conductive material such as Au, Pt, Ni, Cu, W, or alloys thereof. The common electrode 270 supplies current to the light emitting members 370 in cooperation with the pixel electrodes 191.

In the above-described OLED display, the switching control electrode 124a, which is electrically connected to the gate line 121, the switching input electrode 173a, which is electrically connected to the data line 171, and the switching output electrode 175a, form the switching thin film transistor Qs along with the switching semiconductor 154a. The channel of the switching thin film transistor Qs may be formed in the switching semiconductor 154a between the switching input electrode 173a and the switching output electrode 175a.

The driving control electrode 124b, which is electrically connected to the switching output electrode 175a, the driving input electrode 173b, which is electrically connected to the driving voltage line 172, the driving output electrode 175b, which is connected to the pixel electrode 191, and the driving semiconductor 154b, form the driving thin film transistor Qd. The channel of the driving thin film transistor Qd may be formed in the driving semiconductor 154b between the driving input electrode 173b and the driving output electrode 175b.

A pixel electrode 191, a light emitting member 370, and the common electrode 270 form an organic light emitting diode LD having the pixel electrode 191 as an anode and the common electrode 270 as a cathode, or vice versa.

In the above-described exemplary embodiment of the present invention, the semiconductor of the driving thin film transistor may be made of crystalline silicon such that high carrier mobility and stability for flowing sufficient current to the OLED display may be obtained, thereby improving the brightness of the OLED display. In addition, because the channel of the driving thin film transistor is formed in the crystalline semiconductor, the so-called threshold voltage shift phenomenon that may be caused by applying a constant positive voltage in the driving of an OLED display may be excluded (avoided) such that an image-sticking phenomenon is not generated and a reduction in the life time of the OLED display does not occur.

Also, in an exemplary embodiment of the present invention, the gate line 121 and the switching control electrode 124a connected thereto may be formed at different layers and with different materials. That is, the switching control electrode 124a may be disposed under the switching semiconductor 154a and may be made of a refractory metal, and the gate line 121 may be disposed on the switching semiconductor 154a and may be made of a low resistance metal. Accordingly, a control electrode may be disposed under the semiconductor in the bottom gate structure and may be used such that the characteristics of the thin film transistor may be improved.

On the other hand, in the above-described exemplary embodiment, the crystalline semiconductor may be included to improve the characteristics of the thin film transistor. However, a high temperature crystallization process may be required to form the crystalline semiconductor, and because the control electrode is disposed under the semiconductor in the bottom gate structure, the control electrode may be inevitably exposed to the high temperature crystallization process. Accordingly, in the present exemplary embodiment, the control electrode may be formed of a refractory metal such as a molybdenum-containing metal, a chromium-containing metal, a titanium-containing metal, a tantalum-containing metal, or a tungsten-containing metal, that is, a metal having a higher melting temperature than the temperature for the crystallization of the semiconductor, such that the control electrode is prevented from melting or being thermally damaged in the crystallization process of the semiconductor.

Also, in an OLED display of a large size, the signal line such as the gate line may be made of a low resistance metal such as aluminum, copper, or silver so that a signal delay may be prevented. However, because the low resistance metal has a relatively low melting point, it may be melted or may be thermally damaged in the crystallization process. Accordingly, in the present exemplary embodiment, the gate line made of a low resistance metal may be deposited after the completion of the crystallization process such that the low resistance metal is not exposed to a high temperature. The gate line, which may be made of a low resistance metal, may be electrically connected to the control electrode, which may be made of a refractory metal, through the contact hole.

According to this structure of an embodiment, the desired characteristics of a thin film transistor with a crystalline semiconductor and a bottom gate structure may be obtained and a signal delay may be prevented.

Next, a method of manufacturing the OLED display shown in FIGS. 2 and 3 according to one or more embodiments will be described with reference to FIGS. 4 to 15 as well as FIGS. 2 and 3.

FIG. 4, FIG. 6, FIG. 8, FIG. 10, FIG. 12, and FIG. 14 are layout views sequentially showing processes of manufacturing the OLED display shown in FIG. 2 and FIG. 3 according to an exemplary embodiment of the present invention. FIG. 5 is a cross-sectional view of the OLED display shown in FIG. 4 taken along the line V-V. FIG. 7 is a cross-sectional view of the OLED display shown in FIG. 6 taken along the line VII-VII. FIG. 9 is a cross-sectional view of the OLED display shown in FIG. 8 taken along the line IX-IX. FIG. 11 is a cross-sectional view of the OLED display shown in FIG. 10 taken along the line XI-XI. FIG. 13 is a cross-sectional view of the OLED display shown in FIG. 12 taken along the line XIII-XIII, and FIG. 15 is a cross-sectional view of the OLED display shown in FIG. 14 taken along the line XV-XV.

Figure 4:
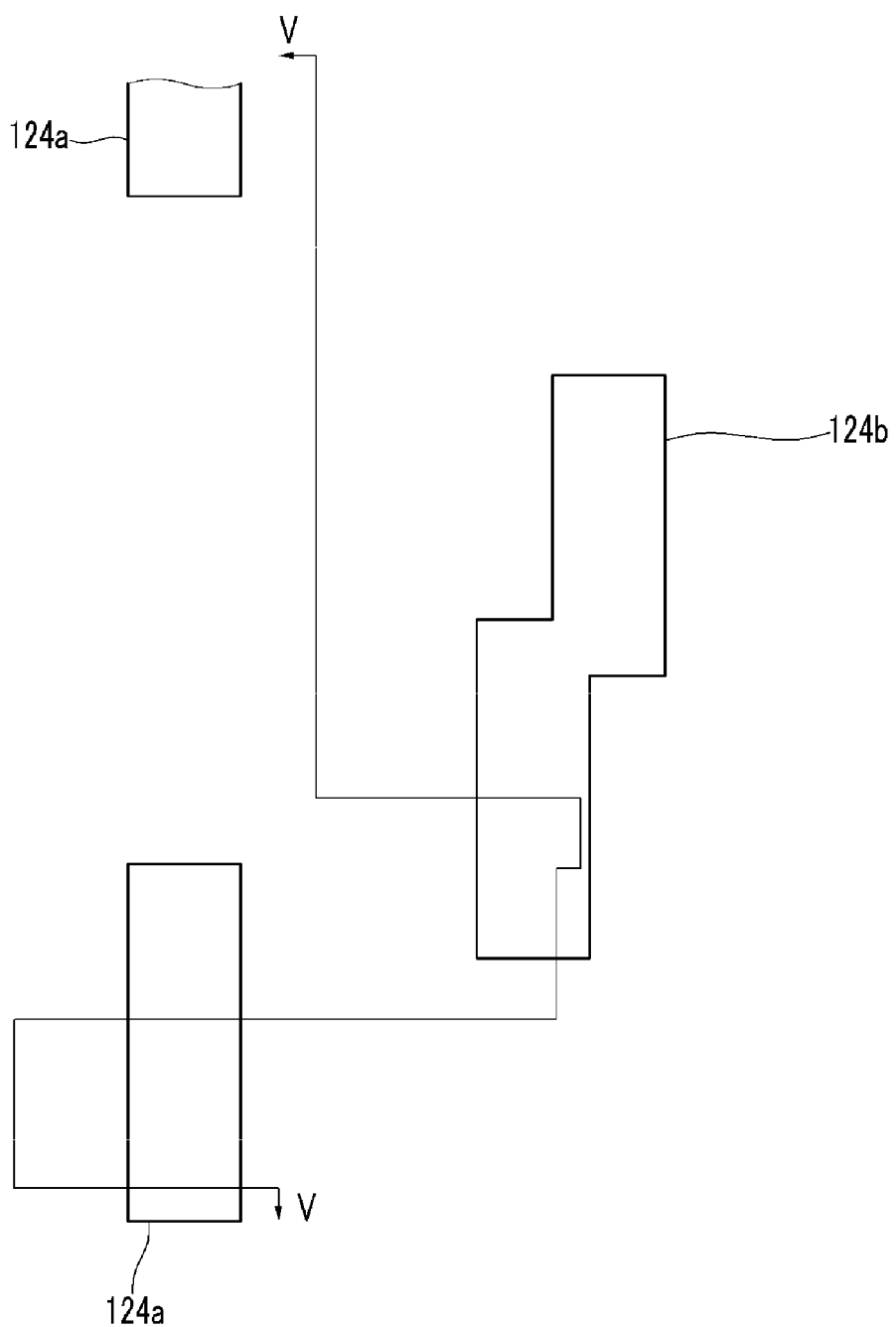
FIG. 4, FIG. 6, FIG. 8, FIG. 10, FIG. 12, and FIG. 14 are layout views sequentially showing processes for manufacturing the OLED display shown in FIG. 2 and FIG. 3 according to an exemplary embodiment of the present invention.
Figure 5:
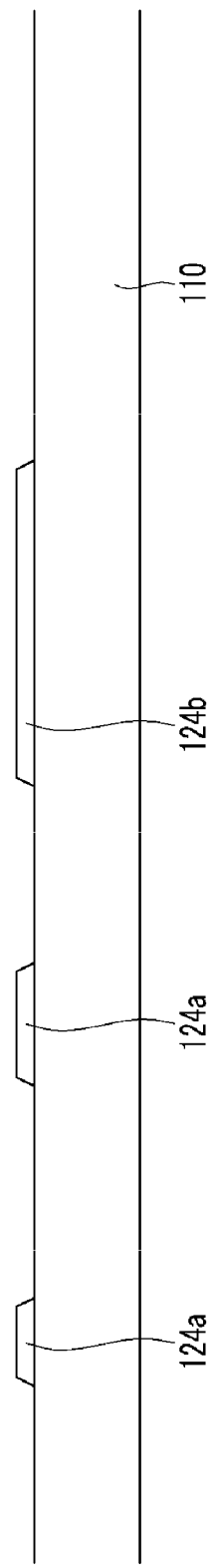
FIG. 5 is a cross-sectional view of the OLED display shown in FIG. 4 taken along the line V-V.

Referring to FIG. 4 and FIG. 5, a refractory metal (not shown) may be deposited on a substrate 110 and patterned by photolithography to form a plurality of switching control electrodes 124a and a plurality of driving control electrodes 124b.

Figure 6:
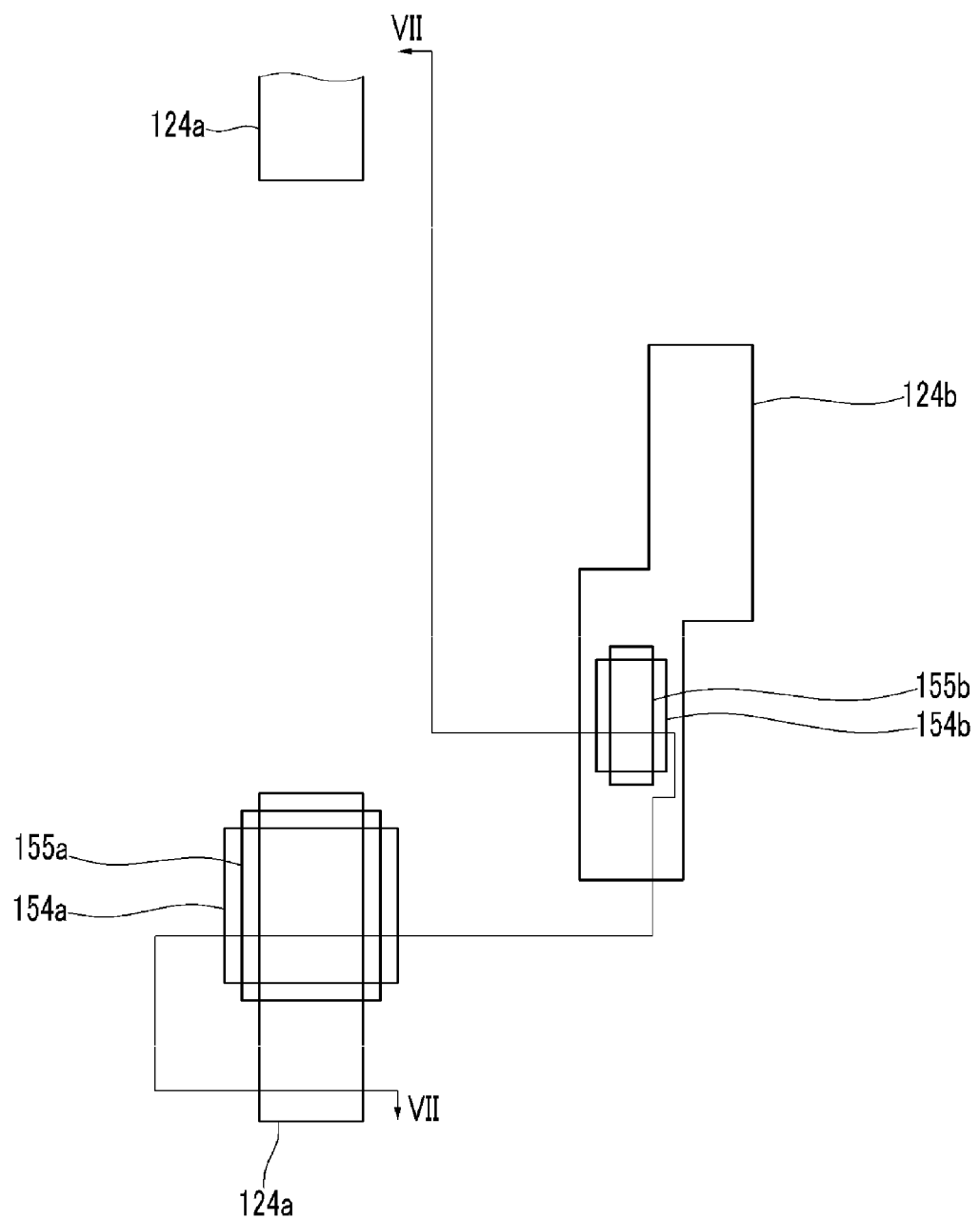
Figure 7:
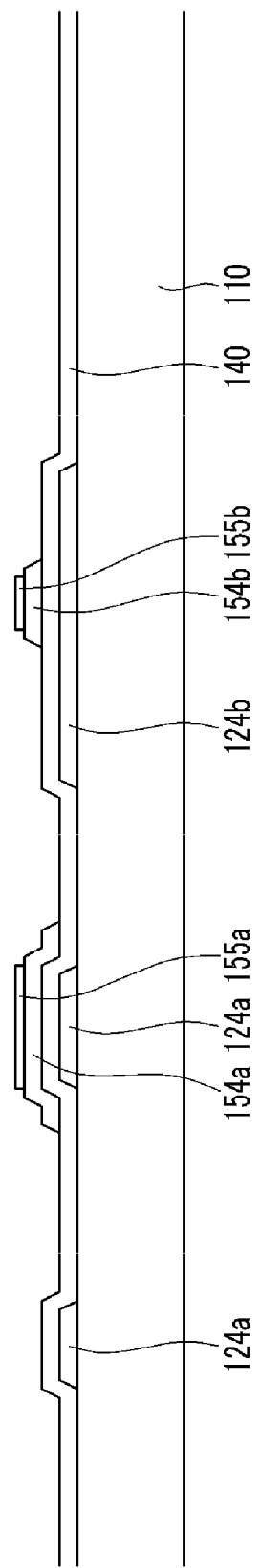
FIG. 7 is a cross-sectional view of the OLED display shown in FIG. 6 taken along the line VII-VII.

Next, referring to FIG. 6 and FIG. 7, a gate insulating layer 140 and an amorphous silicon layer (not shown) may be sequentially deposited on the substrate 110, the switching control electrodes 124a, and the driving control electrode 124b. The amorphous silicon layer may be crystallized. For the crystallization, solid phase crystallization (SPC), rapid thermal annealing (RTA), liquid phase recrystallization (LPR), or excimer laser annealing (ELA) may be used. According to an embodiment, the solid phase crystallization may be used because of its ease in crystallization of a large area. The solid phase crystallization may be executed by heat-treating the amorphous silicon layer for a long time under a temperature of about 500° C. to about 750° C.

Next, the crystallized silicon layer may be patterned by photolithography to form a plurality of switching semiconductors 154a and a plurality of driving semiconductors 154b with an island shape, for example. Next, a silicon nitride layer may be deposited on the switching semiconductor 154a and the driving semiconductor 154b and may be patterned by photolithography to form a plurality of etch stoppers 155a and 155b.

Figure 8:
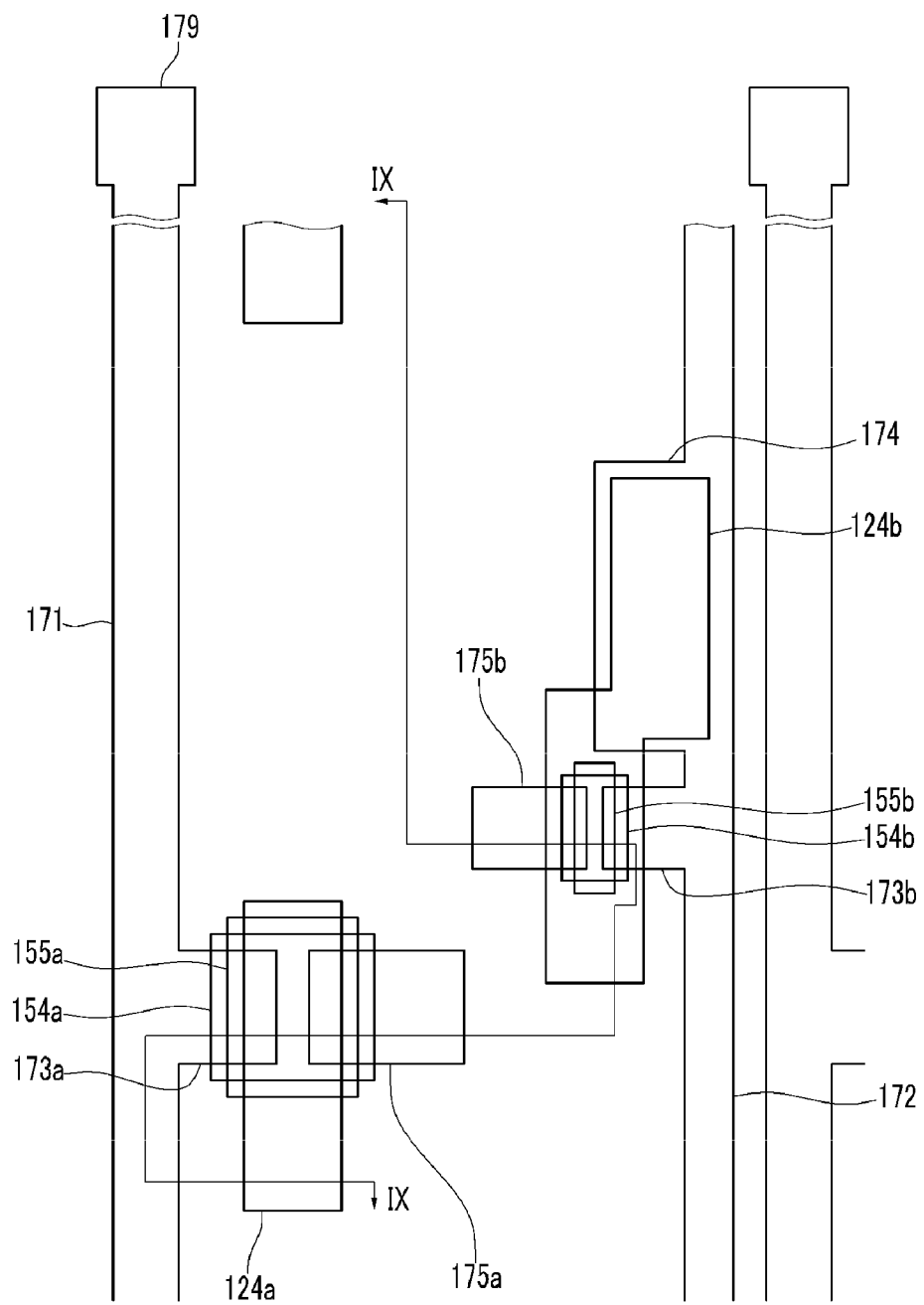
Figure 9:
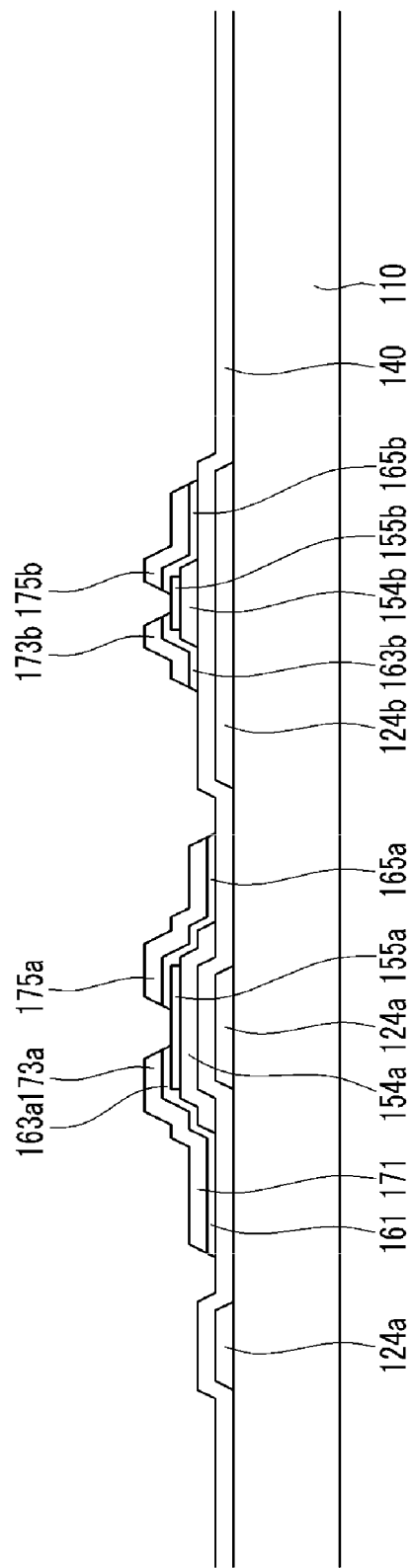
FIG. 9 is a cross-sectional view of the OLED display shown in FIG. 8 taken along the line IX-IX.

Next, referring to FIG. 8 and FIG. 9, an impurity silicon layer (not shown) and a metal layer (not shown) may be sequentially deposited on the gate insulating layer 140, the switching semiconductors 154a, the driving semiconductors 154b, and the etch stoppers 155a and 155b. The metal layer may be patterned by photolithography to form a plurality of data lines 171 including a plurality of switching input electrodes 173a, a plurality of driving voltage lines 172 including a plurality of driving input electrodes 173b, a plurality of switching output electrodes 175a, and a plurality of driving output electrodes 175b.

Next, the impurity silicon layer may be etched by using the switching input electrodes 173a, the switching output electrodes 175a, the driving input electrodes 173b and the driving output electrodes 175b as an etch mask to form a plurality of ohmic contacts 163a, 165a, 163b, and 165b substantially having the same shape as the switching input electrodes 173a, the switching output electrodes 175a, the driving input electrodes 173b and the driving output electrodes 175b in plan view. The etch stoppers 155a and 155b prevent the switching semiconductors 154a and the driving semiconductors 154b from being damaged during etching.

According to an embodiment, a plurality of ohmic contacts 161, 163a, 163b, and 165b may also be formed through the following method. First, an amorphous silicon layer (not shown) may be crystallized, and the etch stoppers 155a and 155b may be formed thereon. Next, the impurity silicon layer (not shown) may be deposited. The crystallized silicon layer and the impurity silicon layer may then be patterned together by photolithography to form a plurality of switching semiconductors 154a and driving semiconductors 154b, and a plurality of ohmic contacts having an island shape, for example. Then, a metal layer may be deposited on the ohmic contact layers and may be patterned by photolithography to form the data lines 171, the driving voltage lines 172, the switching output electrodes 175a, and the driving output electrodes 175b. Next, the ohmic contact layers may be etched by using the switching input electrodes 173a, the switching output electrodes 175a, the driving input electrodes 173b and the driving output electrodes 175b as an etch mask to form a plurality of ohmic contact layers 163a, 165a, 163b, and 165b.

Figure 10:
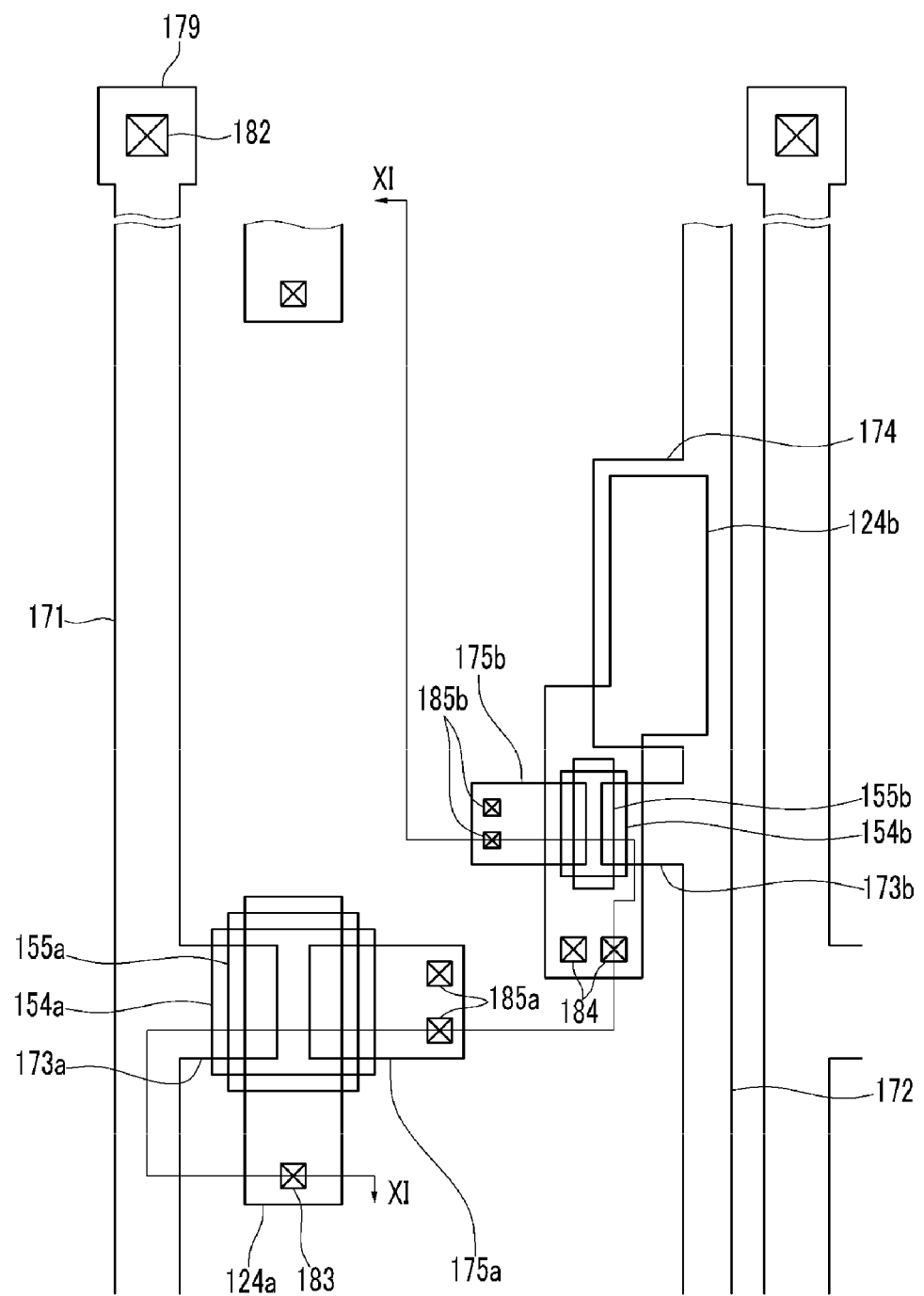
Figure 11:
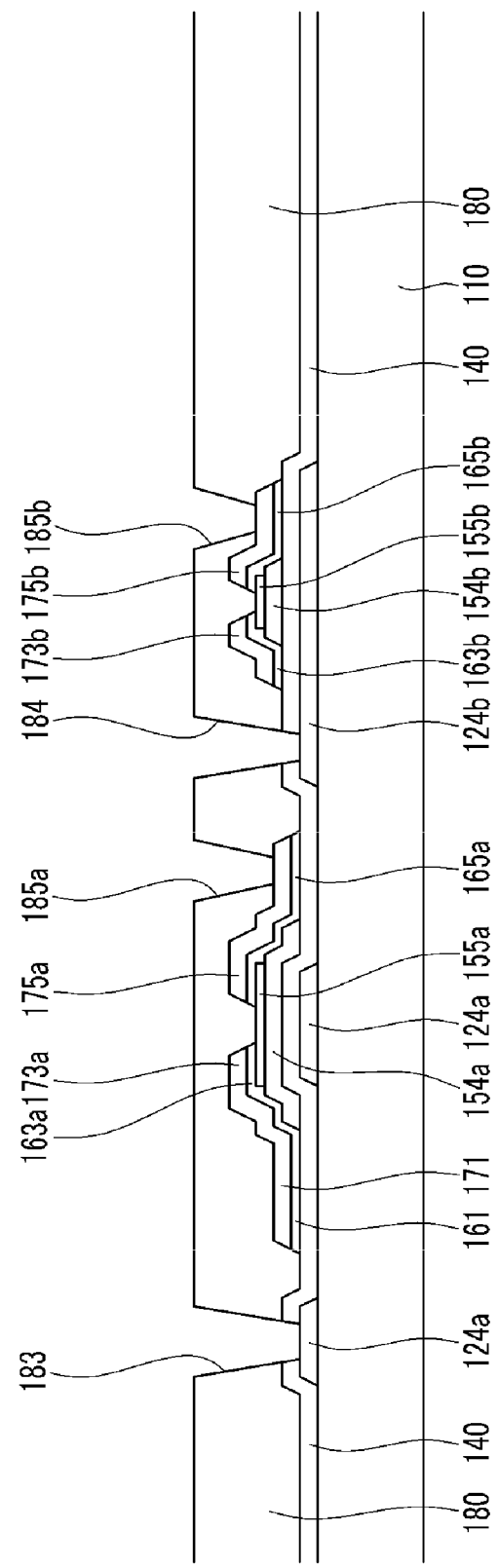
FIG. 11 is a cross-sectional view of the OLED display shown in FIG. 10 taken along the line XI-XI.

Referring to FIG. 10 and FIG. 11, a passivation layer 180 may then be formed on the data lines 171, the driving voltage lines 172, the switching output electrodes 175a, the driving output electrodes 175b, and the gate insulating layer 140. The passivation layer 180 and the gate insulating layer 140 may be patterned by photolithography to form a plurality of contact holes 182, 183, 184, 185a, and 185b.

Figure 12:
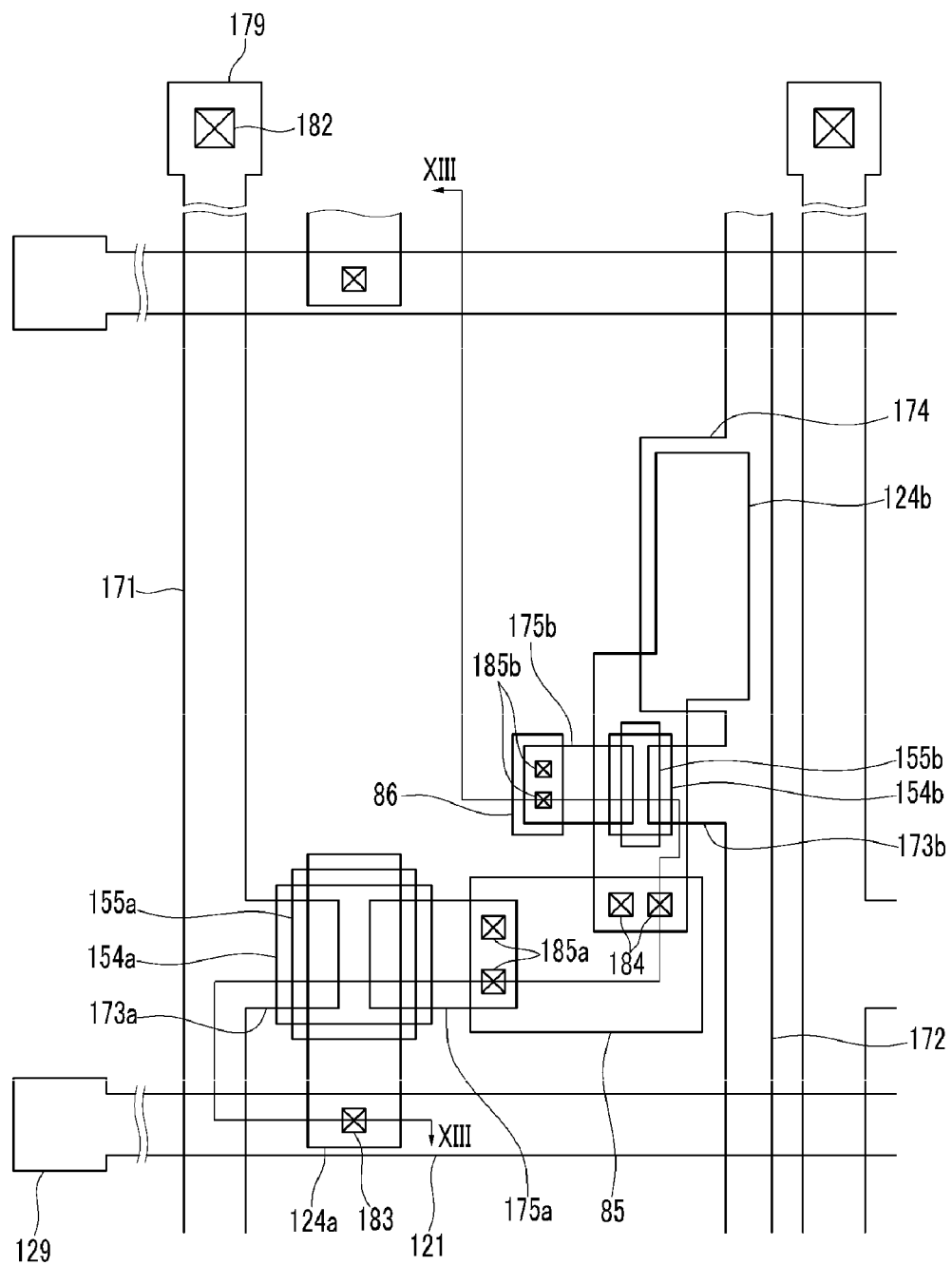
Figure 13:
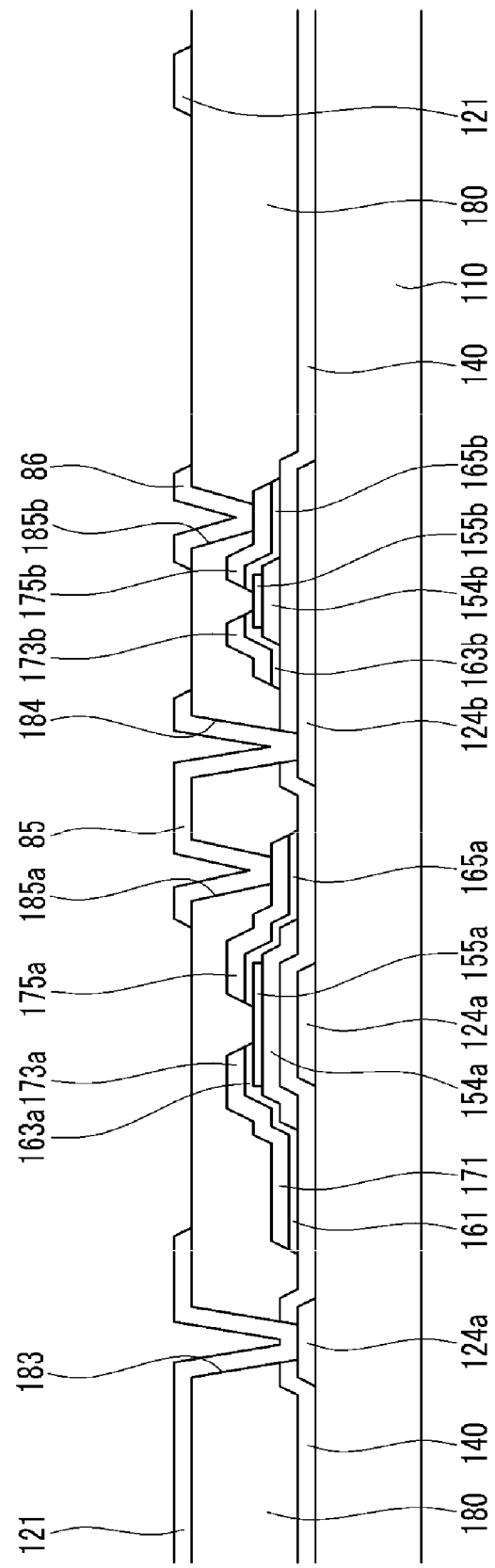
FIG. 13 is a cross-sectional view of the OLED display shown in FIG. 12 taken along the line XIII-XIII.

Next, referring to FIG. 12 and FIG. 13, a low resistance metal layer (not shown) may be deposited on the passivation layer 180, and patterned by photolithography to form a plurality of gate lines 121, a plurality of connecting members 85, and a plurality of contact assistant members 86.

Figure 14:
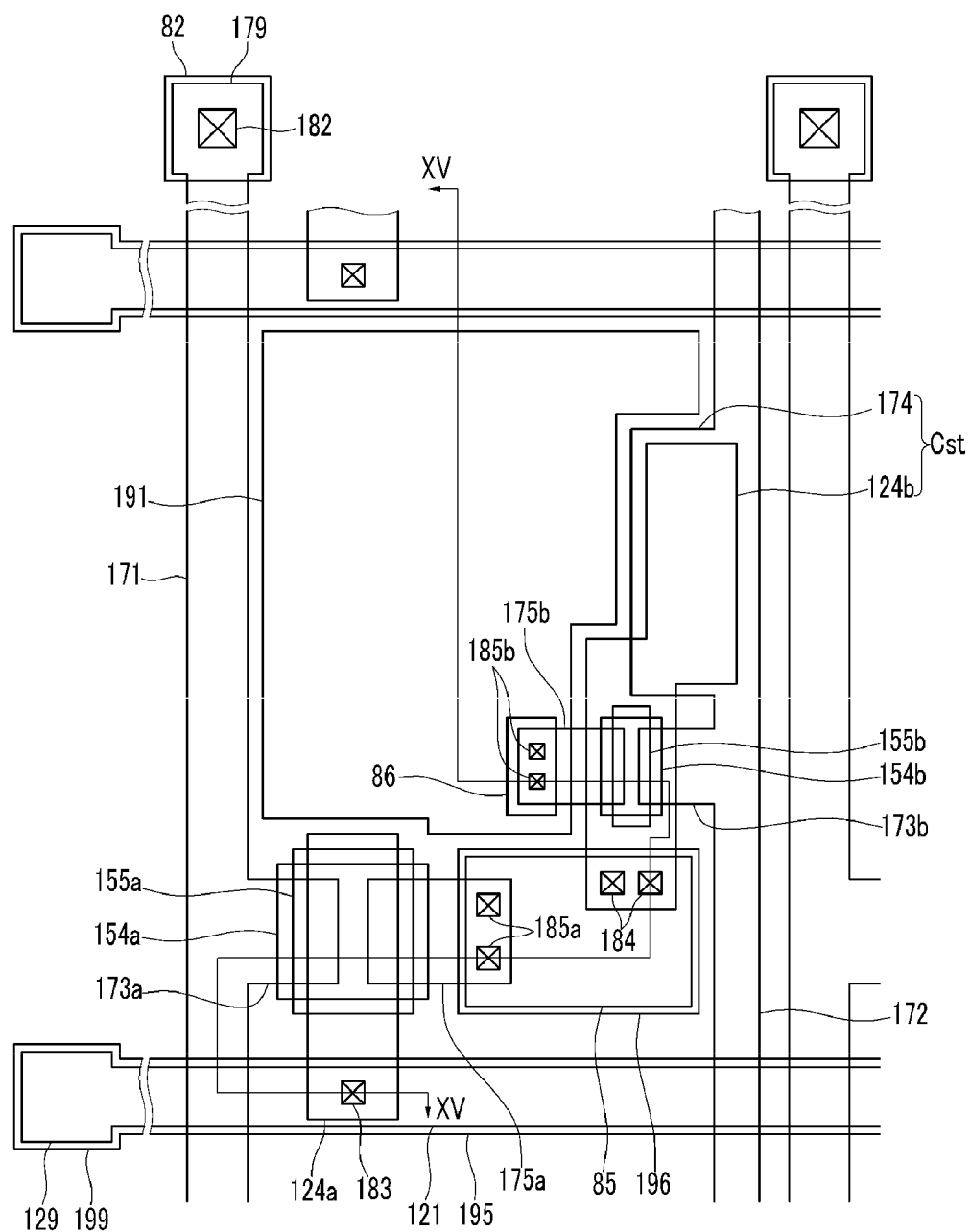
Figure 15:
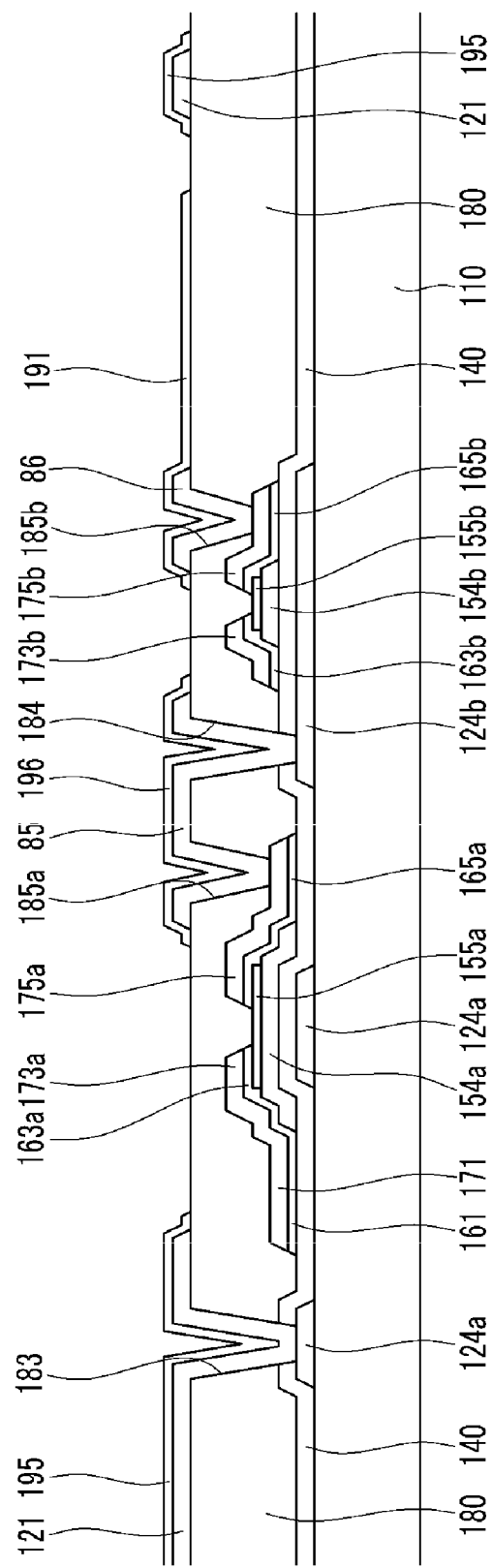
FIG. 15 is a cross-sectional view of the OLED display shown in FIG. 14 taken along the line XV-XV.

Referring to FIG. 14 and FIG. 15, an ITO layer may be deposited on the gate lines 121, the connecting members 85, the contact assistant members 86, and the passivation layer 180 and patterned by photolithography to form a plurality of first protecting members 195 covering the gate lines 121, a plurality of second protecting members 196 covering the connecting members 85, a plurality of pixel electrodes 191 disposed on the contact assistant members 86, and a plurality of contact assistants 82 disposed on the end portions 179 of the data lines 171.

The first protecting members 195 and the second protecting members 196 cover the gate lines 121 and the connecting members 85 such that the first protecting members 195 and the second protecting members 196 may prevent the gate lines 121 and the connecting members 85 from corroding due to contact with, for example, a chemical solution such as an etchant in the photolithography process of the ITO layer.

Next, referring to FIG. 2 and FIG. 3, an organic insulating layer 361 may be coated on the first protecting members 195, the second protecting members 196, and the pixel electrodes 191, and may be exposed and developed to form a plurality of openings 365.

Then, a plurality of organic light emitting members 370 including a hole transport layer (not shown) and an emission layer (not shown) may be formed in the openings 365. The light emitting members 370 may be formed by a solution process such as Inkjet printing method or a deposition process using a shadow mask (not shown). According to an embodiment, the Inkjet printing method may be used in which an ink solution is dripped in the opening 365 while moving an Inkjet head (not shown), and a drying process is followed after forming each layer.

Finally, a common electrode 270 may be formed on the organic insulating layer 361 and the organic light emitting members 370.

EXEMPLARY EMBODIMENT 2

Next, an OLED display according to another exemplary embodiment of the present invention will be described in detail with reference to FIG. 16 and FIG. 17 as well as FIG. 1.

An OLED display of the top emission type will be described in the present exemplary embodiment, which may be different from the above-described exemplary embodiment. The overlapping descriptions with the previous exemplary embodiment are omitted, and the same constituent elements are indicated by the same reference numerals.

Figure 16:
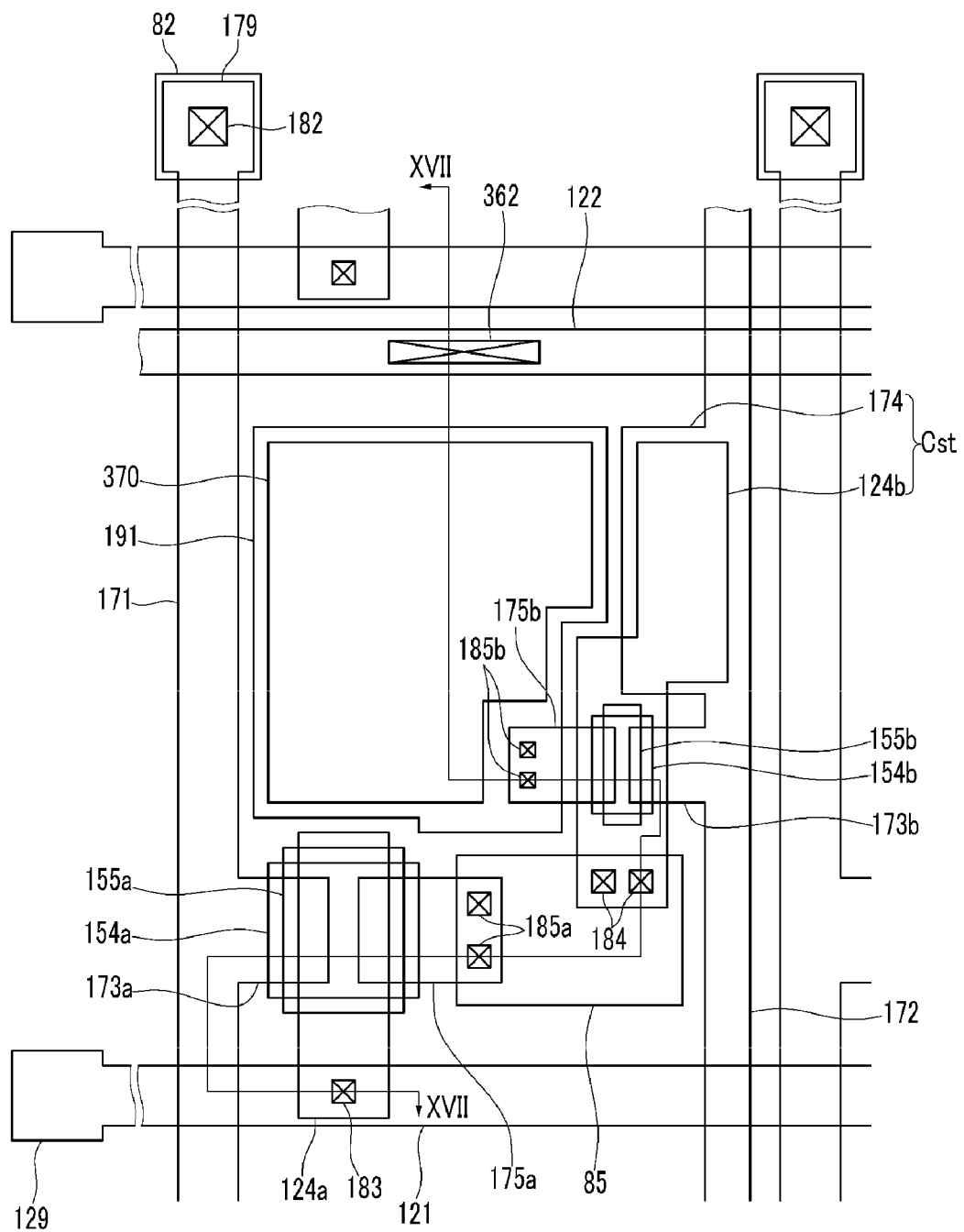
FIG. 16 is a layout view of an OLED display according to another exemplary embodiment of the present invention.
Figure 17:
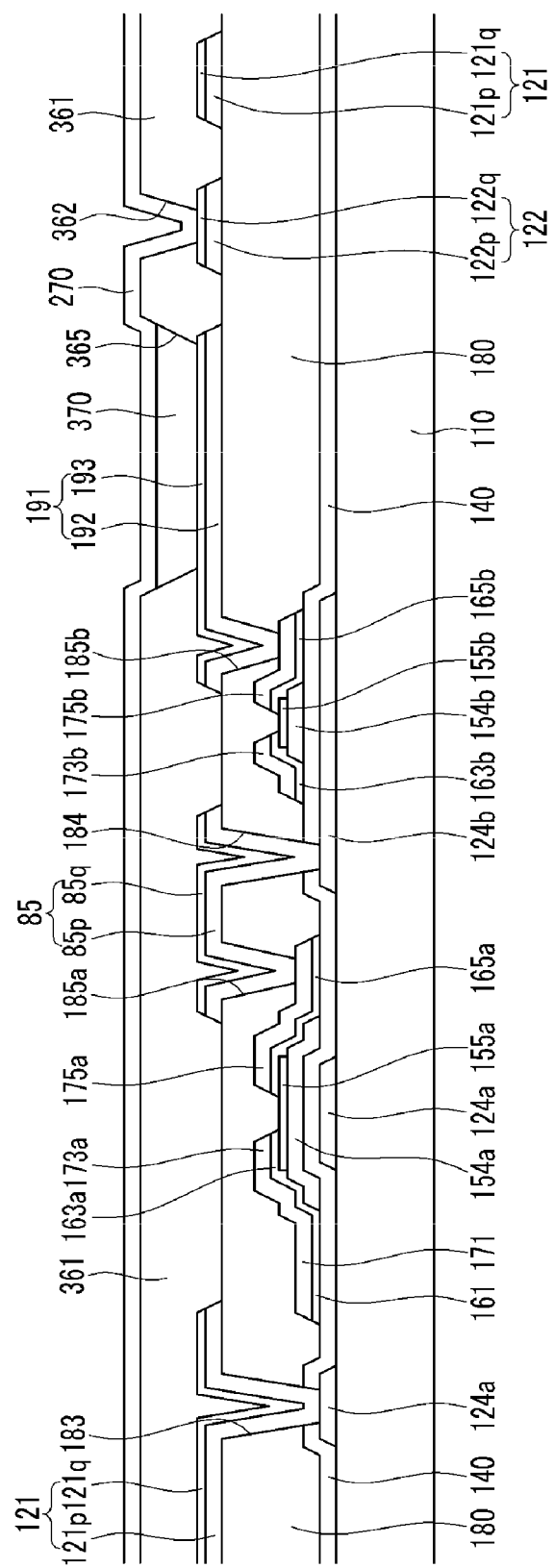
FIG. 17 is a cross-sectional view of the OLED display shown in FIG. 16 taken along the line XVII-XVII.

FIG. 16 is a layout view of an OLED display according to the present exemplary embodiment, and FIG. 17 is a cross-sectional view of the OLED display shown in FIG. 16 taken along the line XVII-XVII.

A plurality of switching control electrodes 124a and a plurality of driving control electrodes 124b may be made of a refractory metal, and may be formed on an insulating substrate 110.

A gate insulating layer 140 may be formed on the switching control electrodes 124a, the driving control electrodes 124b and the insulating substrate 110, and a plurality of switching semiconductors 154a and a plurality of driving semiconductors 154b may be formed on the gate insulating layer 140 with an island shape, for example.

A plurality of etch stoppers 155a and 155b may be respectively formed on the switching semiconductors 154a and the driving semiconductors 154b.

A plurality of ohmic contact layers 161, 163a, 165a, 163b, and 165b, a plurality of data lines 171 including a plurality of switching input electrodes 173a and a plurality of end portions 179, a plurality of driving voltage lines 172 including a plurality of driving input electrodes 173b and a plurality of storage electrodes 174, a plurality of switching output electrodes 175a, and a plurality of driving output electrodes 175b may be formed on the etch stoppers 155a and 155b, the switching semiconductors 154a, the driving semiconductors 154b, and the gate insulating layer 140.

A passivation layer 180 having a plurality of contact holes 182, 183, 184, 185a, and 185b may be formed on the data lines 171, the driving voltage lines 172, the switching output electrodes 175a, and the driving output electrodes 175b.

A plurality of gate lines 121, a plurality of voltage assistant lines 122, a plurality of connecting members 85, a plurality of pixel electrodes 191, and a plurality of contact assistants 82 may be formed on the passivation layer 180.

The gate lines 121 may include lower gate lines 121p, which may be made of an opaque metal having low resistance such as Al, Cu, or Ag, and upper gate lines 121q, which may be made of a transparent conductive material such as ITO or IZO. The gate lines 121 may be electrically connected to the switching control electrodes 124a through the contact holes 183, and may include a plurality of end portions 129 for connection with another layer or with an external driving circuit.

The voltage assistant lines 122 transmit a common voltage and may be parallel to the gate lines 121. The voltage assistant lines 122 may also include lower voltage assistant lines 122p, which may be made of an opaque metal having low resistance, and upper voltage assistant lines 122q, which may be made of a transparent conductive material such as ITO or IZO.

The connecting members 85 may also include lower connecting members 85p, which may be made of an opaque metal having low resistance, and upper connecting members 85q, which may be made of a transparent conductive material such as ITO or IZO.

The pixel electrodes 191 may be connected to the driving output electrodes 175b through the contact holes 185b, and may include lower pixel electrodes 192, which may be made of an opaque metal having low resistance, and upper pixel electrodes 193, which may be made of a transparent conductive material such as ITO or IZO.

The contact assistants 82 may include lower contact assistants (not shown), which may be made of an opaque metal having low resistance, and upper contact assistants (not shown), which may be made of a transparent conductive material such as ITO or IZO.

An organic insulating layer 361 may be formed on the gate lines 121, the voltage assistant lines 122, the connecting members 85, the pixel electrodes 191, and the passivation layer 180. The organic insulating 361 may have a plurality of openings 365 exposing the pixel electrodes 191 and a plurality of contact holes 362 exposing the voltage assistant lines 122.

A plurality of organic light emitting members 370 including auxiliary layers and emission layers may be formed in the openings 365. The organic light emitting members 370 may contact the upper pixel electrodes 193, which may be made of a transparent conductive material such as ITO or IZO in the openings 365. The transparent conductive material such as ITO or IZO has a low difference of work function with respect to the organic light emitting members 370 to thereby improve the moving efficiency of the charges.

A common electrode 270 may be formed on the organic light emitting members 370. The common electrode 270 may be disposed on the whole surface of the substrate, and may be formed of a transparent conductive such as ITO or IZO for the top emission. The common electrode 270 may be electrically connected to the voltage assistant lines 122 through the contact holes 362.

As described above with respect to an embodiment, the voltage assistant lines 122 connected to the common electrode 270 are provided, so even if the common electrode 270 is made of a transparent conductive material having high resistance such as ITO or IZO, the common voltage may be stably applied to the common electrode 270. Accordingly, a drop of the common voltage may be reduced, and the common voltage may be uniformly applied to the whole region of the common electrode 270 such that cross-talk due to a difference in brightness may be reduced.

In the above exemplary embodiment, the driving voltage line 172 is parallel to the data line 171 and the voltage assistant line 122 is parallel to the gate line 121, but the driving voltage line 172 may be parallel to the gate line 121 and the voltage assistant line 122 may be parallel to the data line 171.

Next, the manufacturing method of the OLED display shown in FIG. 16 and FIG. 17 according to one or more embodiments will be described in detail with reference to FIG. 18 through FIG. 25 as well as FIG. 16, FIG. 17 and FIG. 4 through FIG. 7.

FIG. 18, FIG. 20, FIG. 22, and FIG. 24 are layout views sequentially showing processes of manufacturing the OLED display shown in FIG. 16 according to another exemplary embodiment of the present invention. FIG. 19 is a cross-sectional view of the OLED display shown in FIG. 18 taken along the line XIX-XIX. FIG. 21 is a cross-sectional view of the OLED display shown in FIG. 20 taken along the line XXI-XXI. FIG. 23 is a cross-sectional view of the OLED display shown in FIG. 22 taken along the line XXIII-XXIII, and FIG. 25 is a cross-sectional view of the OLED display shown in FIG. 24 taken along the line XXV-XXV.

Figure 18:
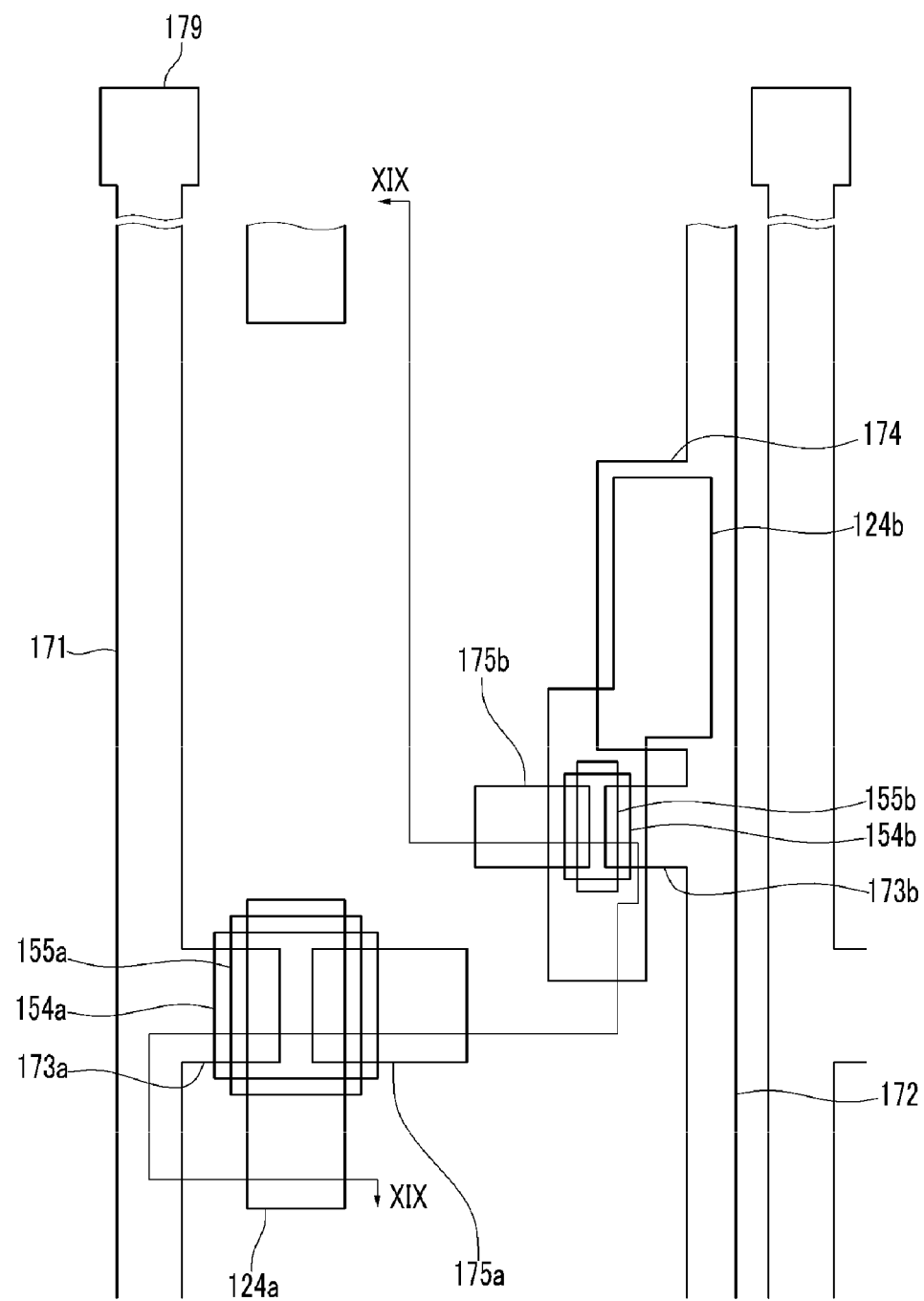
FIG. 18, FIG. 20, FIG. 22, and FIG. 24 are layout views sequentially showing processes for manufacturing the OLED display shown in FIG. 16 according to another exemplary embodiment of the present invention.
Figure 19:
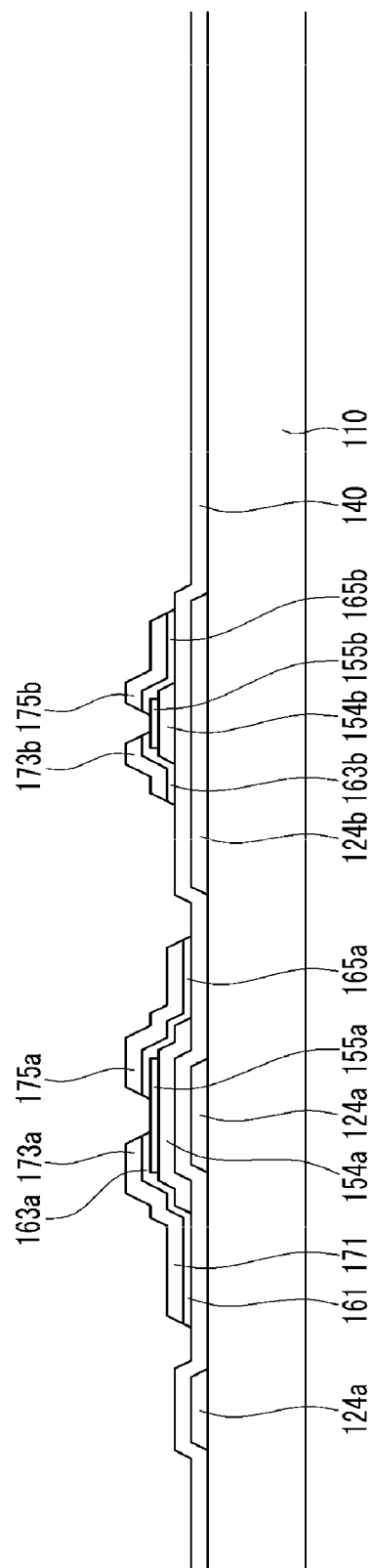
FIG. 19 is a cross-sectional view of the OLED display shown in FIG. 18 taken along the line XIX-XIX.

Referring to FIG. 18 and FIG. 19, as in the above described exemplary embodiment, the switching thin film transistor part and the driving thin film transistor part are formed. The switching thin film transistor part may include a plurality of switching control electrodes 124a, a plurality of switching semiconductors 154a, a plurality of etch stoppers 155a, a plurality of ohmic contacts 161, 163a, and 165b, a plurality of data lines 171 including a plurality of switching input electrodes 173a, and a plurality of switching output electrodes 175a. The driving thin film transistor part may include a plurality of driving control electrodes 124b, a plurality of driving semiconductors 154b, a plurality of etch stoppers 155b, a plurality of ohmic contacts 163b and 165b, a plurality of driving voltage lines 172 including a plurality of driving input electrodes 173b and a plurality of storage electrodes 174, and a plurality of driving output electrodes 175b.

Figure 20:
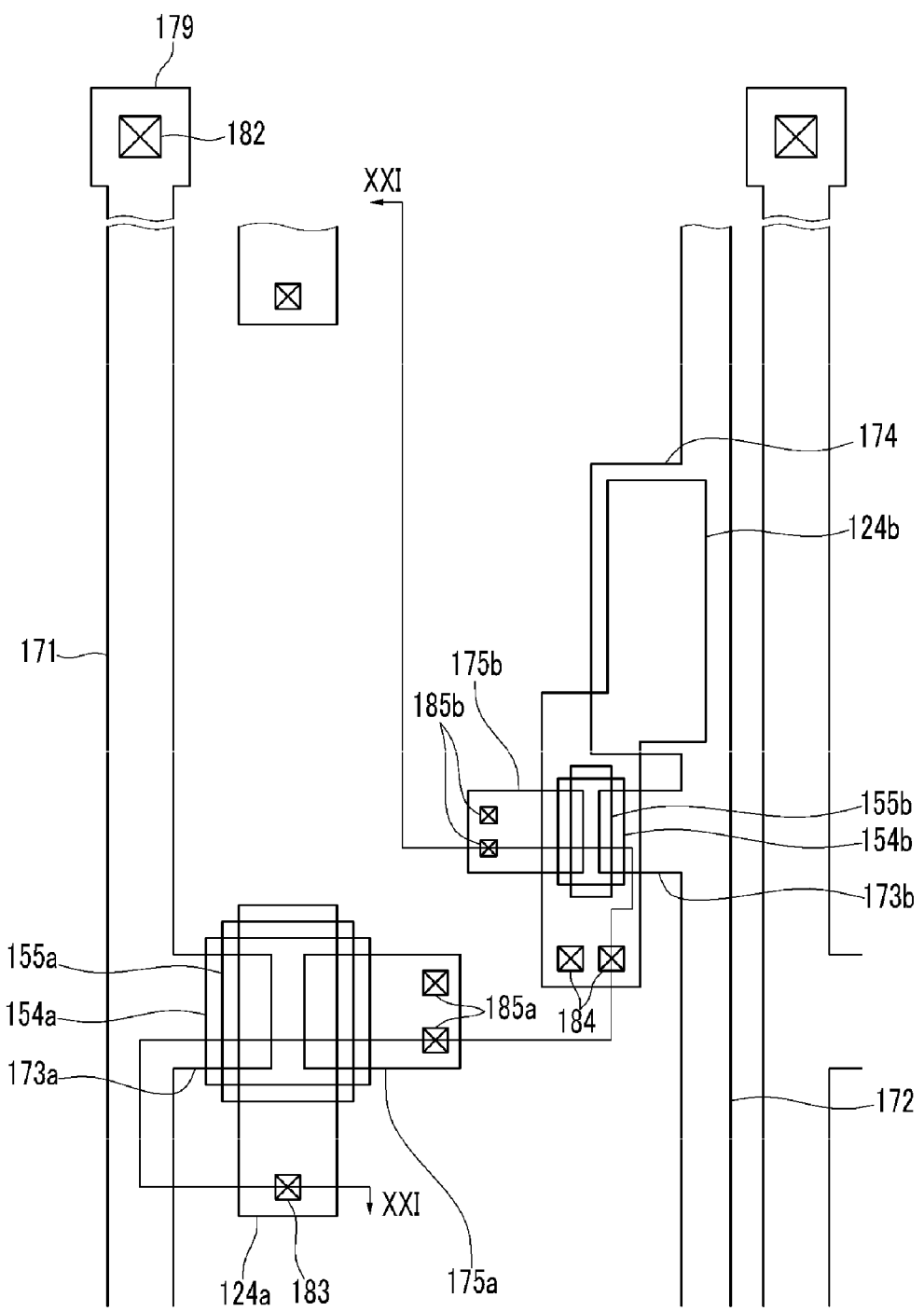
Figure 21:
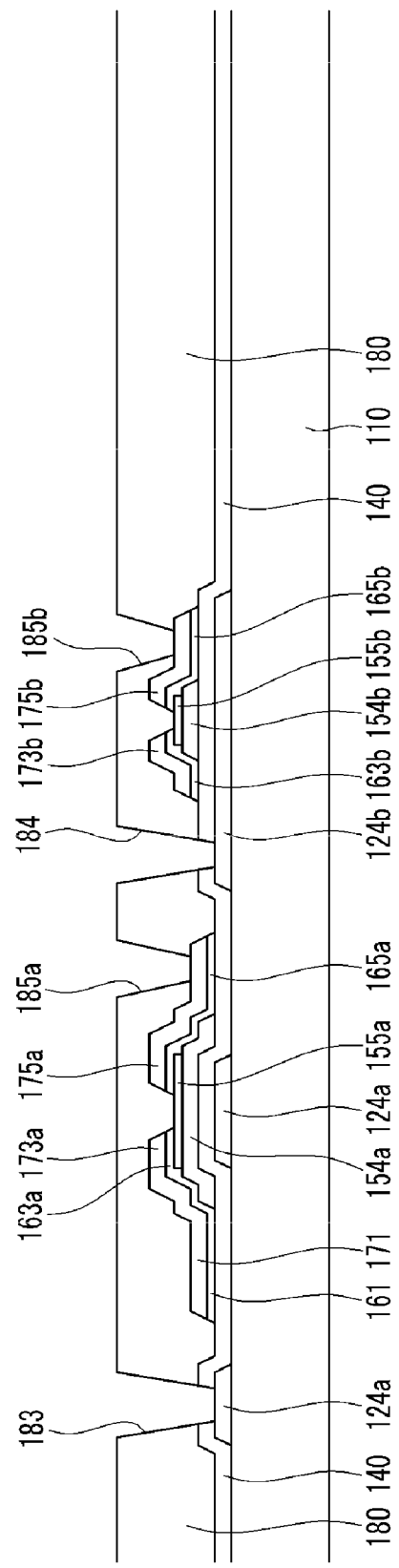
FIG. 21 is a cross-sectional view of the OLED display shown in FIG. 20 taken along the line XXI-XXI.

Next, referring to FIG. 20 and FIG. 21, a passivation layer 180 may be formed on the data lines 171, the driving voltage lines 172, the switching output electrodes 175a, the driving output electrodes 175b, and the gate insulating layer 140. The passivation layer 180 and the gate insulating layer 140 may be patterned by photolithography to form a plurality of contact holes 182, 183, 184, 185a, and 185b.

Figure 22:
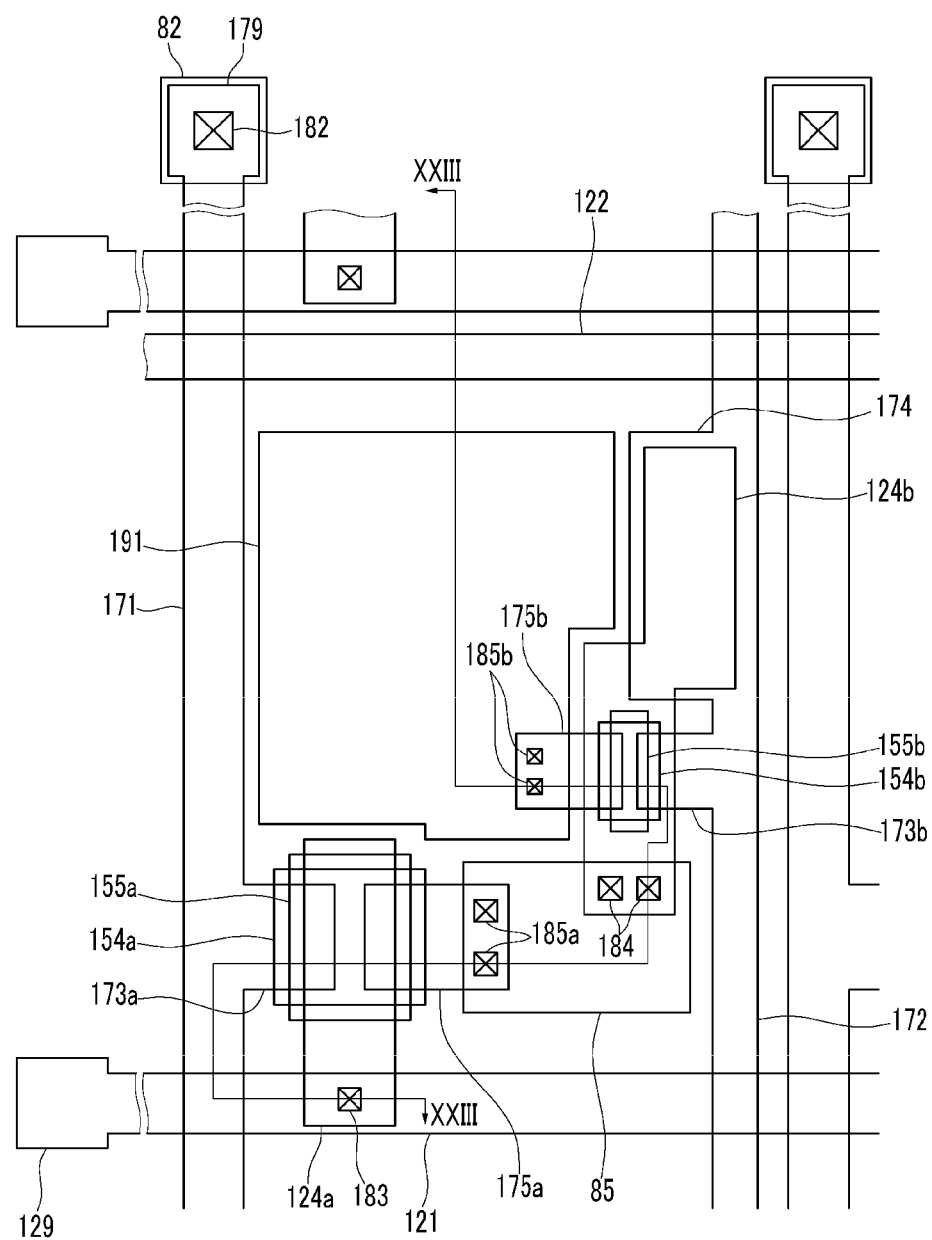
Figure 23:
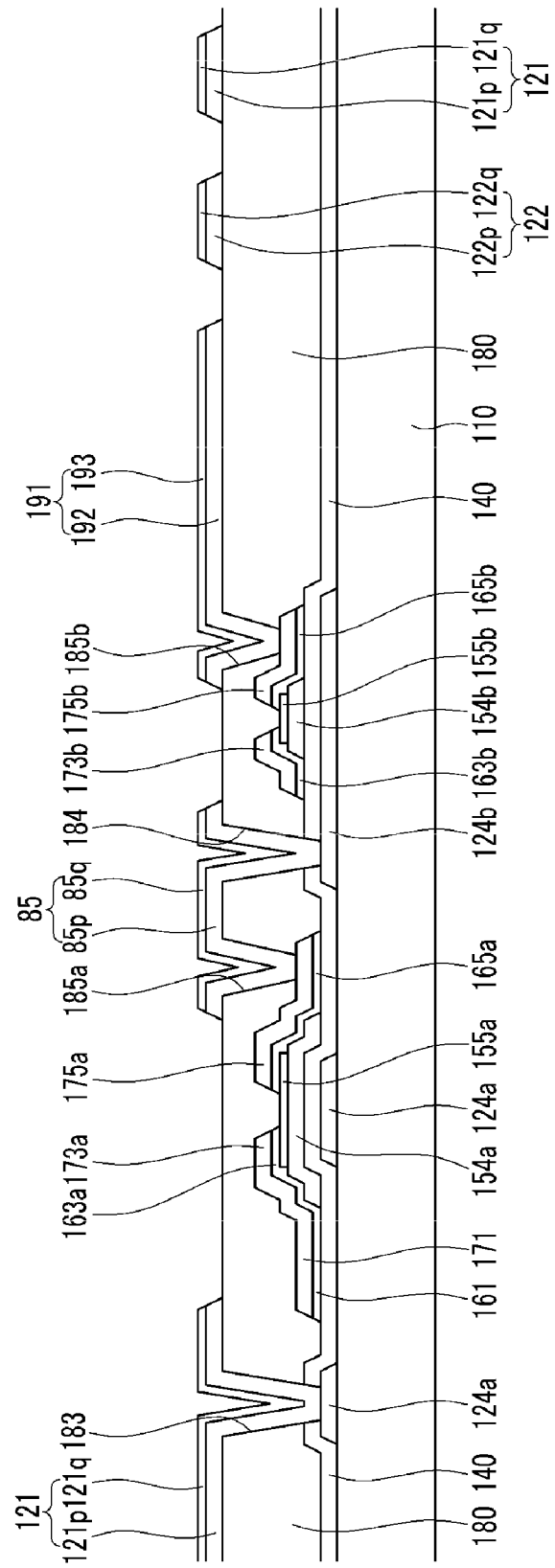
FIG. 23 is a cross-sectional view of the OLED display shown in FIG. 22 taken along the line XXIII-XXIII.

Next, referring to FIG. 22 and FIG. 23, an opaque metal layer (not shown) with low resistance and an ITO layer (not shown) may be sequentially deposited on the passivation layer 180 and patterned by photolithography to form a plurality of gate lines 121 including lower gate lines 121p and upper gate lines 121q, a plurality of voltage assistant lines 122 including lower voltage assistant lines 122p and upper voltage assistant lines 122q, a plurality of connecting members 85 including lower connecting members 85p and upper connecting members 85q, a plurality of pixel electrodes 191 including lower pixel electrodes 192 and upper pixel electrodes 193, and a plurality of contact assistants 82 including lower contact assistants (not shown) and upper contact assistants (not shown).

Figure 24:
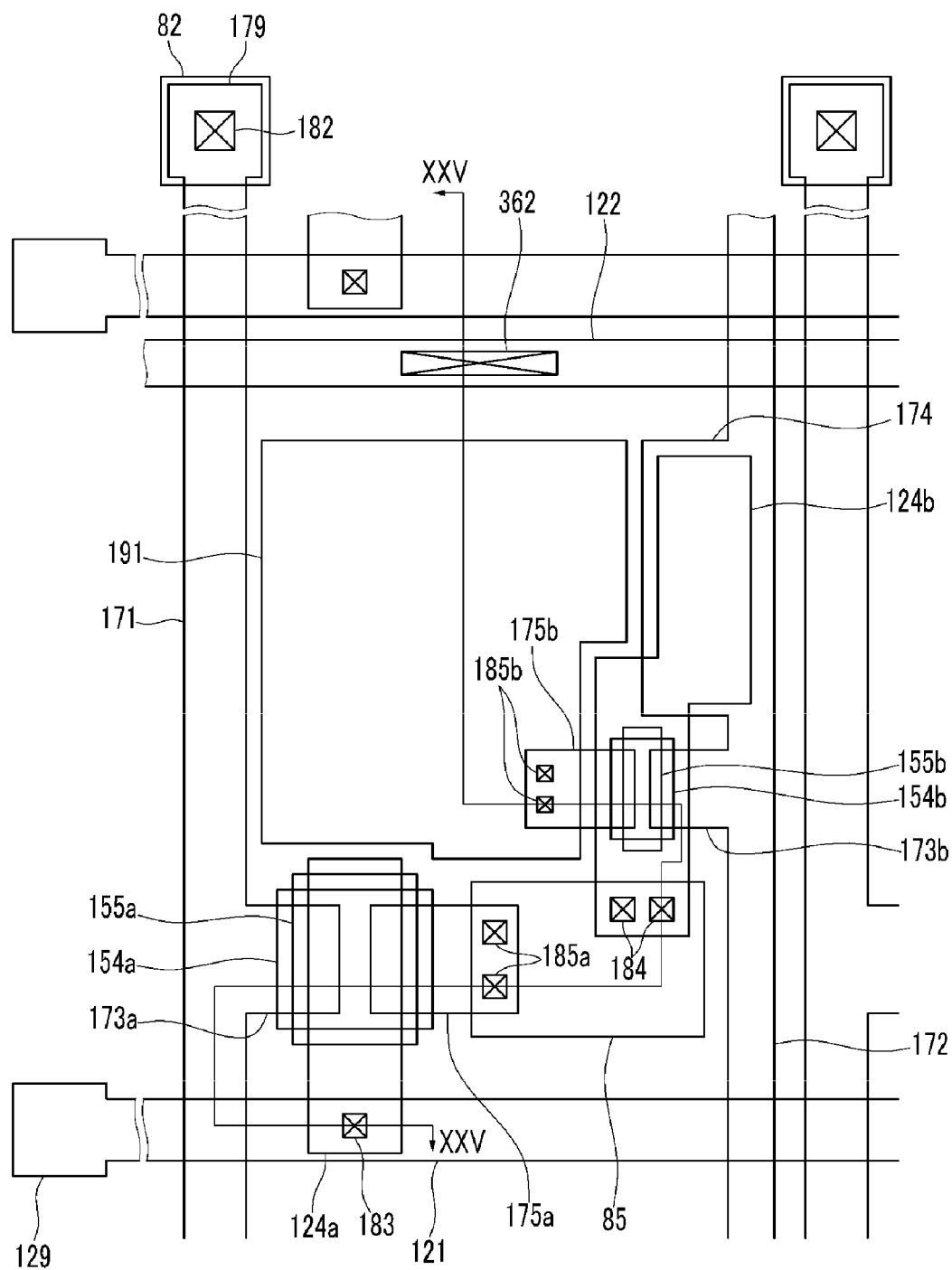
Figure 25:
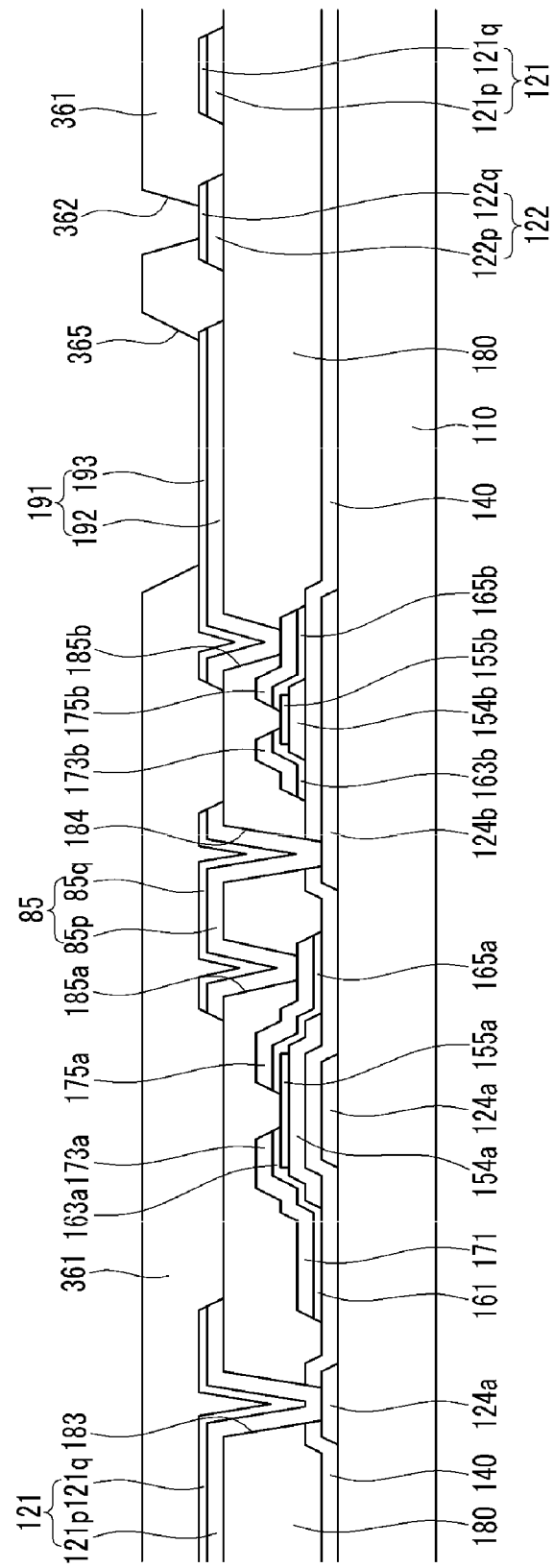
FIG. 25 is a cross-sectional view of the OLED display shown in FIG. 24 taken along the line XXV-XXV.

Next, referring to FIG. 24 and FIG. 25, an organic insulating layer 361 may be coated on the gate lines 121, the voltage assistant lines 122, the connecting members 85, and the pixel electrodes 191, and may be exposed and developed to form a plurality of openings 365 exposing the pixel electrodes 191 and a plurality of contact holes 362 exposing the voltage assistant lines 122.

Next, referring to FIG. 16 and FIG. 17, a plurality of organic light emitting members 370 including a hole transport layer (not shown) and an emission layer (not shown) may be formed in the openings 365.

Finally, a common electrode 270 may be formed on the organic insulating layer 361 and the organic light emitting members 370.

While one or more embodiments of this invention have been described, it is to be understood that the invention is not limited to the disclosed embodiments, but, on the contrary, is intended to cover various modifications and equivalent arrangements included within the spirit and scope of the appended claims.

What is claimed is:

1. An OLED display comprising:
   a first control electrode and a second control electrode formed on a substrate;
   a first crystalline semiconductor and a second crystalline semiconductor formed on the first control electrode and the second control electrode;
   a first input electrode and a first output electrode spaced apart from each other on the first crystalline semiconductor;
   a second input electrode and a second output electrode facing each other on the second crystalline semiconductor;
   an insulating layer formed on the first input electrode, the first output electrode, the second input electrode, and the second output electrode, and having a first contact hole exposing the first control electrode, a second contact hole exposing the first output electrode, a third contact hole exposing the second control electrode, and a fourth contact hole exposing the second output electrode;
   a gate line formed on the insulating layer and connected to the first control electrode through the first contact hole;
   a pixel electrode connected to the second output electrode through the fourth contact hole;
   a common electrode facing the pixel electrode; and
   a light emitting member disposed between the pixel electrode and the common electrode.

2. The OLED display of claim 1, wherein
   the gate line includes a metal having a lower melting point than that of the first control electrode.

3. The OLED display of claim 2, wherein
   the gate line includes one selected from an aluminum-containing metal, a copper-containing metal, and a silver-containing metal, and
   the first control electrode includes one selected from a molybdenum-containing metal, a chromium-containing metal, a titanium-containing metal, a tantalum-containing metal, and a tungsten-containing metal.

4. The OLED display of claim 2, wherein
   the gate line and the pixel electrode are formed on the same layer.

5. The OLED display of claim 4, further comprising
   a connecting member connecting the first output electrode and the second control electrode to each other through the second contact hole and the third contact hole,
   wherein the connecting member is formed on the same layer as the gate line and the pixel electrode.

6. The OLED display of claim 5, further comprising
   a voltage assistant line connected to the common electrode,
   wherein the voltage assistant line is formed on the same layer as the gate line, the pixel electrode, and the connecting member.

7. The OLED display of claim 4, further comprising
   a voltage assistant line connected to the common electrode,
   wherein the voltage assistant line is formed on the same layer as the gate line and the pixel electrode.

8. A method for manufacturing an OLED display, comprising:
   forming a first control electrode and a second control electrode on a substrate;
   forming a first crystalline semiconductor and a second crystalline semiconductor on the first control electrode and the second control electrode;
   forming a first input electrode and a first output electrode spaced apart from each other on the first crystalline semiconductor, and forming the second input electrode and the second output electrode facing each other on the second crystalline semiconductor;
   forming an insulating layer on the first input electrode, the first output electrode, the second input electrode, and the second output electrode;
   forming a gate line connected to the first control electrode on the insulating layer;
   forming a pixel electrode on the insulating layer;
   forming a light emitting member on the pixel electrode; and
   forming a common electrode on the light emitting member.

9. The method of claim 8, wherein
   the forming of the first crystalline semiconductor and the second crystalline semiconductor includes
   depositing an amorphous silicon layer, and
   crystallizing the amorphous silicon layer by using solid phase crystallization (SPC).

10. The method of claim 9, wherein
    the first control electrode and the second control electrode include a first metal having a higher melting point than a temperature of solid phase crystallization, and
    the gate line includes a second metal having a lower melting point than that of the first metal.

11. The method of claim 10, further comprising
    a protecting member covering the gate line and is formed during the forming of the pixel electrode.

12. The method of claim 10, wherein
    the gate line and the pixel electrode are formed concurrently.

13. The method of claim 12, wherein
    a voltage assistant line connected to the common electrode is formed concurrently with the gate line and the pixel electrode.

* * * * *